(12) United States Patent
Shimomura et al.

(10) Patent No.: US 10,347,313 B2
(45) Date of Patent: Jul. 9, 2019

(54) MAGNETIC MEMORY

(71) Applicant: KABUSHIKI KAISHA TOSHIBA, Minato-ku (JP)

(72) Inventors: Naoharu Shimomura, Tokyo (JP); Tomoaki Inokuchi, Yokohama (JP); Katsuhiko Koui, Yokohama (JP); Yuzo Kamiguchi, Yokohama (JP); Hiroaki Yoda, Kawasaki (JP); Hideyuki Sugiyama, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/915,654

(22) Filed: Mar. 8, 2018

(65) Prior Publication Data

US 2019/0088302 A1 Mar. 21, 2019

(30) Foreign Application Priority Data

Sep. 21, 2017 (JP) .................. 2017-181110
Feb. 28, 2018 (JP) .................. 2018-035239

(51) Int. Cl.
*G11C 11/16* (2006.01)
*H01L 43/08* (2006.01)
*G11C 11/18* (2006.01)
*H01L 27/22* (2006.01)
*H01L 43/06* (2006.01)

(52) U.S. Cl.
CPC ........ *G11C 11/1675* (2013.01); *G11C 11/161* (2013.01); *G11C 11/18* (2013.01); *H01L 27/228* (2013.01); *H01L 43/06* (2013.01); *H01L 43/08* (2013.01); *G11C 11/1673* (2013.01)

(58) Field of Classification Search
CPC .................. G11C 11/1675; G11C 11/1673
USPC .......................................... 365/158
See application file for complete search history.

(56) References Cited

U.S. PATENT DOCUMENTS

| | | | |
|---|---|---|---|
| 9,660,582 B2* | 5/2017 | Wang | G11C 11/1673 |
| 10,102,894 B2* | 10/2018 | Shimomura | G11C 11/1657 |
| 10,109,334 B2* | 10/2018 | Yoda | G11C 11/1675 |
| 10,147,473 B2* | 12/2018 | Yoda | G11C 11/161 |
| 2019/0006415 A1* | 1/2019 | Li | G11C 11/1655 |

FOREIGN PATENT DOCUMENTS

JP 2017-112351 6/2017

* cited by examiner

*Primary Examiner* — Son L Mai
(74) *Attorney, Agent, or Firm* — Oblon, McClelland, Maier & Neustadt, L.L.P.

(57) ABSTRACT

According to one embodiment, a magnetic memory includes: magnetoresistive effect elements arranged on an conductive layer; and a first circuit which passes a write current through the conductive layer and applies a control voltage to the magnetoresistive effect elements, to write data including a first value and a second value into the magnetoresistive effect elements. The first circuit adjusts at least one of a write sequence of the first value and the second value, a current value of the write current, and a pulse width of the write current, on the basis of an arrangement of the first value and the second value in the data.

19 Claims, 18 Drawing Sheets

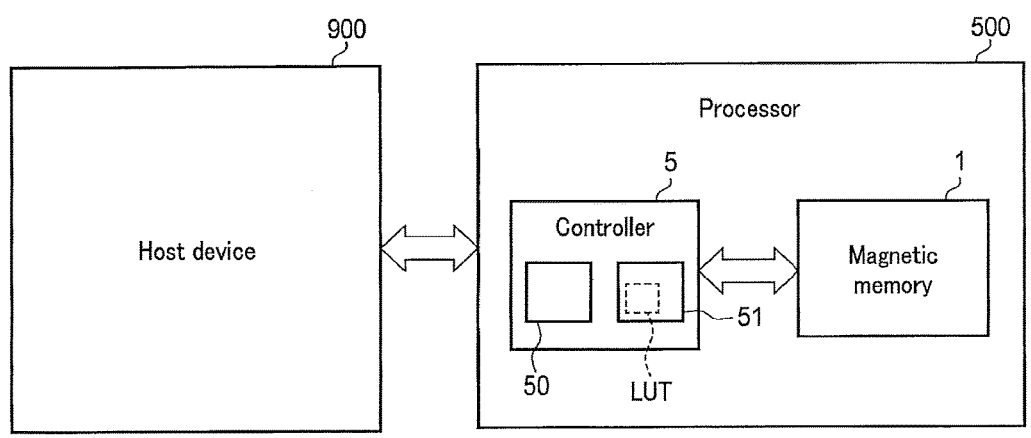
F I G. 1

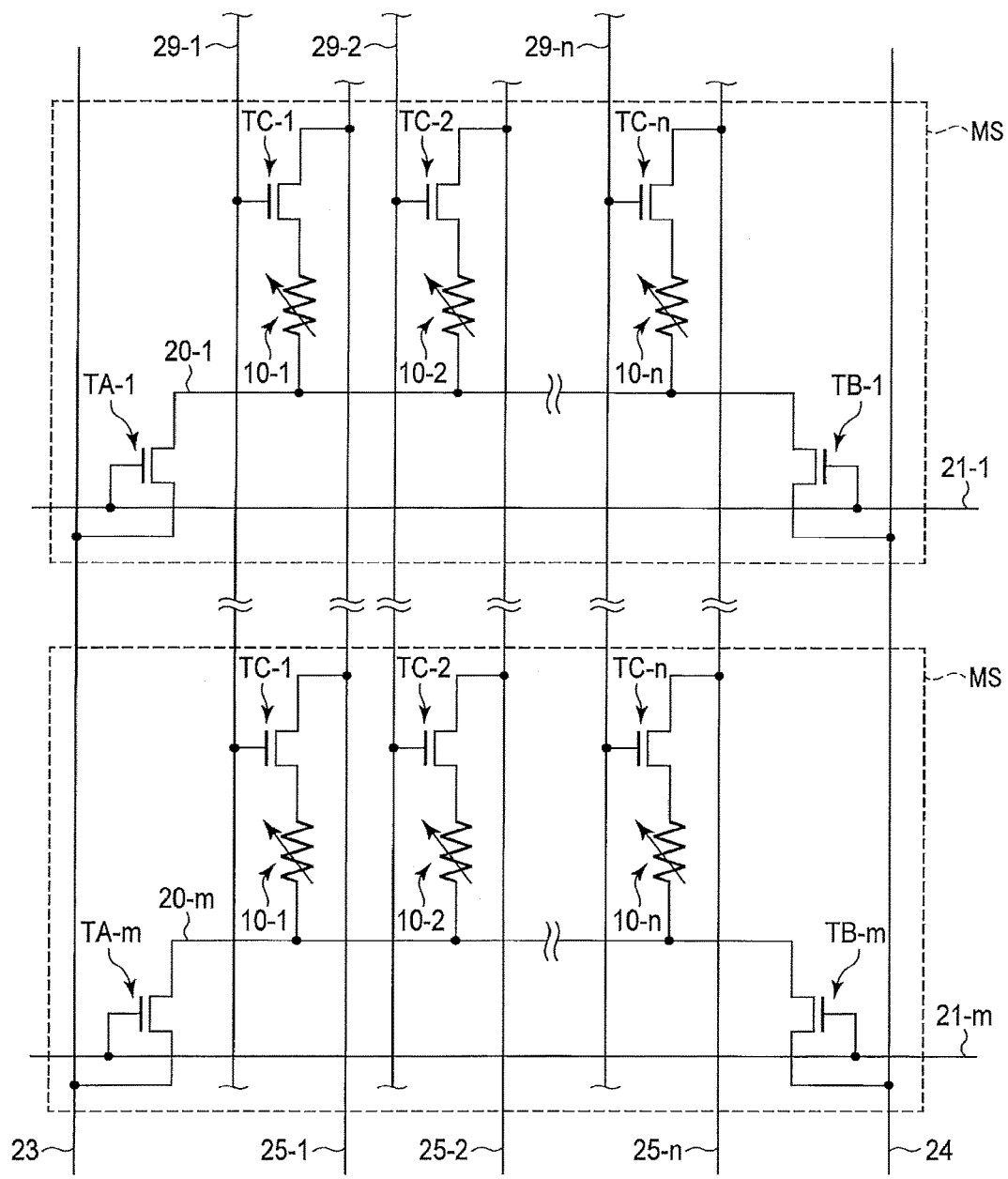
F I G. 4

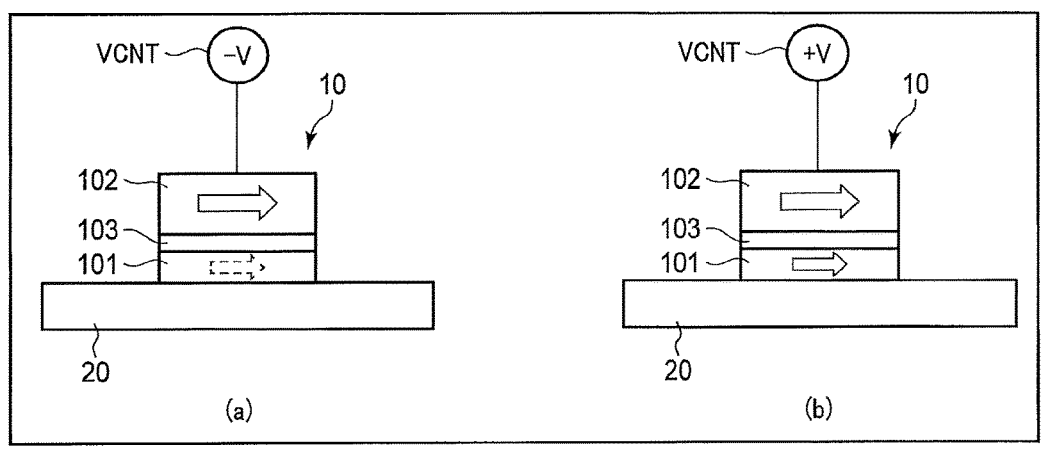
F I G. 7

| Write data | Write sequence | Current value | Pulse width |
|---|---|---|---|
| 00000000 | 0→1 | X1 | W1 |
| 00000001 | 0→1 | X1 | W1 |
| 00000010 | 0→1 | X1 | W1 |
| ⋮ | ⋮ | ⋮ | ⋮ |
| 01101001 | 1→0 | X2 | W2 |
| ⋮ | ⋮ | ⋮ | ⋮ |
| 11111110 | 1→0 | X3 | W3 |
| 11111111 | 1→0 | X3 | W3 |

F I G. 15

MAGNETIC MEMORY

CROSS-REFERENCE TO RELATED APPLICATIONS

This application is based upon and claims the benefit of priority from Japanese Patent Applications No. 2017-181110, filed Sep. 21, 2017; and No. 2018-035239, filed Feb. 28, 2018, the entire contents of all of which are incorporated herein by reference.

FIELD

Embodiments, described herein relate generally to a magnetic memory.

BACKGROUND

Magnetic memories using magnetoresistive effect elements as memory elements are under development and study.

BRIEF DESCRIPTION OF THE DRAWINGS

FIG. 1 is a block diagram showing a configuration example of a magnetic memory according to a first embodiment;

FIG. 4 is an equivalent circuit diagram showing a configuration example of the magnetic memory according to the first embodiment;

FIG. 7 is a diagram illustrating the principles of the magnetic memory according to the first embodiment;

FIG. 15 is a table illustrating a specific example of the magnetic memory according to the first embodiment;

DETAILED DESCRIPTION

Figure 2:
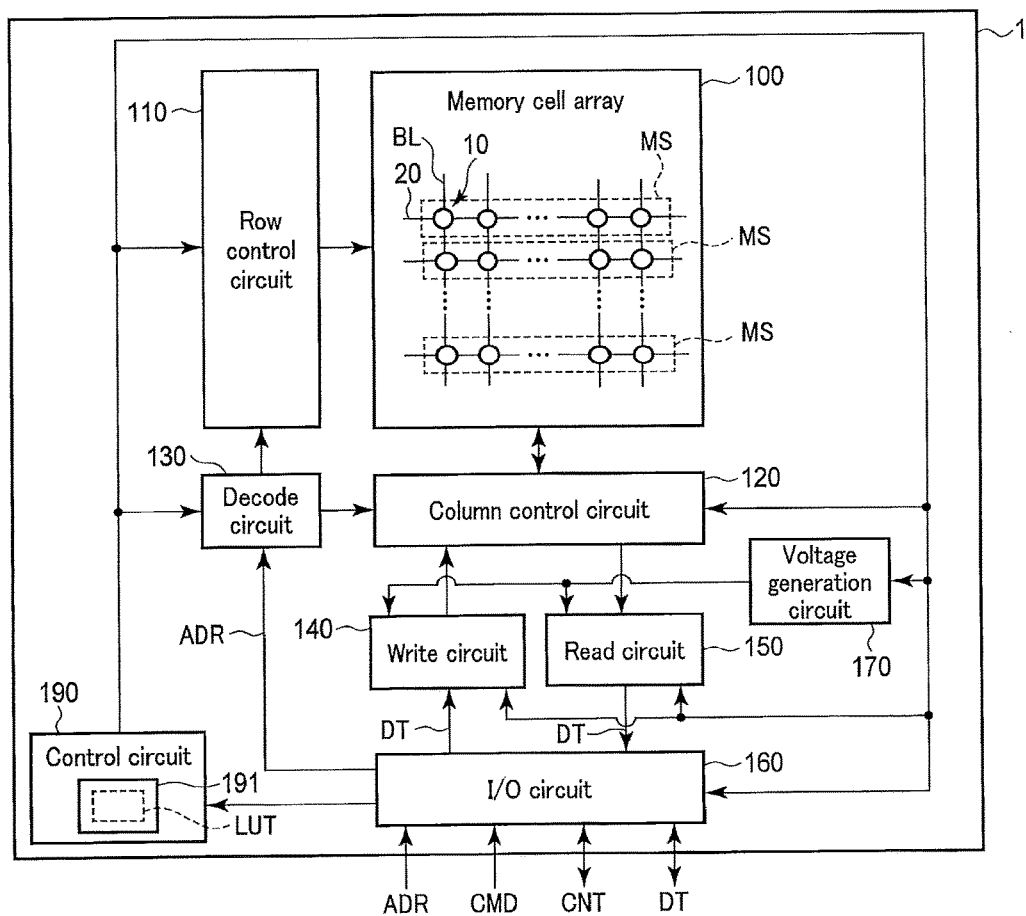
FIG. 2 is a block diagram showing a configuration example of the magnetic memory according to the first embodiment.

In general, according to one embodiment, a magnetic memory includes: magnetoresistive effect elements arranged on an conductive layer; and a first circuit which passes a write current through the conductive layer and applies a control voltage to the magnetoresistive effect elements, to write data including a first value and a second value into the magnetoresistive effect elements. The first circuit adjusts at least one of a write sequence of the first value and the second value, a current value of the write current, and a pulse width of the write current, on the basis of an arrangement of the first value and the second value in the data.

A magnetic memory according to an embodiment is described with reference to FIG. 1 to FIG. 21.

The present embodiment is described below in detail with reference the drawings. In the description below, the same reference signs are assigned to elements having the same functions and configurations.

Moreover, in each embodiment below, when there is no need for differentiation between components having reference signs with numbers/alphabetic characters at the end for differentiation (e.g. a word line WL, a bit line BL, various voltages and signals, and others), representations (reference signs) whose numbers/alphabetic characters at the end are omitted are used.

Embodiment

A magnetic memory according to embodiment is described with reference to FIG. 1 to FIG. 21.

(I) First Embodiment

A magnetic memory according to a first embodiment is described with reference to FIG. 1 to FIG. 18.

(1) Configuration

An overall configuration of the magnetic memory according to the present embodiment is described with reference to FIG. 1 to FIG. 4.

FIG. 1 is a block diagram showing one example of a memory system including the magnetic memory according to the present embodiment.

As shown in FIG. 1, the memory system includes, for example, a magnetic memory 1 according to the present embodiment, a memory controller 5, and a host device 900.

The host device 900 can request the magnetic memory 1 for various operations such as writing (storing) of data, reading of data, and erasing of data, via the memory controller 5.

The magnetic memory (memory device) 1 according to the present embodiment includes a magnetoresistive effect element as a memory element.

The magnetic memory 1 is directly or indirectly connected to the memory controller 5. For example, the magnetic memory 1 is a storage class memory or a main memory.

The memory controller 5 is directly or indirectly coupled to the host device 900 via a connection terminal, a connector, or a cable.

The memory controller 5 can control operation of the magnetic memory 1. The memory controller 5 includes a processing circuit 50, a built-in memory 51, an ECC circuit, and others.

The memory controller 5 generates a command on the basis of a request from the host device 900. The memory controller 5 transmits the generated command to the magnetic memory 1.

The magnetic memory 1 performs an operation corresponding to the command from the memory controller 5.

For example, when the request from the host device 900 is writing of data, the memory controller 5 transmits a write command to the magnetic memory. Together with the write command, the memory controller 5 transmits an address of a memory cell to be selected, data to be written into the memory cell, and a control signal. The magnetic memory 1 writes the data to be written, into the selected address on the basis of the write command and the control signal.

For example, when the request from the host device 900 is reading of data, the memory controller 5 transmits a read command to the magnetic memory. Together with the read command, the memory controller 5 transmits an address of a memory cell to be selected, and a control signal. The magnetic memory 1 reads data from the selected address on the basis of the read command and the control signal. The magnetic memory 1 transmits the read data to the memory controller 5. The memory controller 5 receives the data from the magnetic memory 1. The memory controller 5 transmits the data from the magnetic memory 1, to the host device 900.

For example, the memory controller 5 can provide the magnetic memory 1 with control information for the operation of the magnetic memory 1 by management information (e.g. a lookup table) LUT in the built-in memory 51.

Thus, the magnetic memory 1 performs a predetermined operation in the memory system by the control from the other devices 900 and 5.

For example, the magnetic memory 1 and the memory controller 5 are provided in a processor 500. The host device 900 is electrically coupled to the processor 500. The host device 900 is at least one device selected from the group consisting of a portable terminal, a smartphone, a game device, a processor, a server, and a personal computer or the like.

Hereinafter, at least one of the memory controller 5 and the host device 900 is referred to as an external device.

Note that the magnetic memory 1 according to the present embodiment may be a memory in the memory controller 5 or the host device 900. In this case, the magnetic memory 1 is controlled by a CPU in the memory controller 5 or by a CPU (or controller) in the host device 900. Moreover, in the present embodiment, the memory controller 5 may be provided in the host device 900. The processor 500 may be provided in the host device 900.

FIG. 2 is a block diagram showing an internal configuration of the magnetic memory according to the embodiment.

As shown in FIG. 2, the magnetic memory 1 according to the present embodiment includes a memory cell array 100, a row control circuit 110, a column control circuit 120, a decode circuit 130, a write circuit 140, a read circuit 150, an I/O circuit 160, a voltage generation circuit 170, and a control circuit 190.

The memory cell array 100 includes memory cell strings (control units) MS.

Each memory cell string MS includes memory elements (also referred to as memory cells) 10. In the memory cell string MS, the memory elements 10 are connected to a common electrode (interconnect) 20. In the memory cell string MS, the memory elements 10 are connected to, for example, different bit lines BL. In the present embodiment, the memory element 10 is a magnetoresistive effect element.

A detailed configuration of the memory cell string MS will be described later.

The row control circuit 110 controls rows of the memory cell array 100. A decoding result (row address) of the address from the decode circuit 130 is supplied to the row control circuit 110. The row control circuit 110 sets, to a selected state, a row (e.g. at least one electrode 20) based on the decoding result of the address. Hereinafter, the row set to the selected state is referred to as a selected row. The rows other than the selected row are referred to as unselected rows.

The column control circuit 120 controls columns of the memory cell array 100. A decoding result (column address) of the address from the decode circuit 130 is supplied to the column control circuit 120. The column control circuit 120 sets, to a selected state, a column (e.g. at least one bit line BL) based on the decoding result of the address. Hereinafter, the column set to the selected state is referred to as a selected column. The columns other than the selected column are referred to as unselected columns.

The decode circuit 130 decodes an address ADR from the I/O circuit 160. The decode circuit 130 supplies a decoding result of the address ADR to the row control circuit 110 and the column control circuit 120. The address (e.g. a physical address) ADR includes a column address to be selected and a row address to be selected.

The write circuit (also referred to as a write control circuit or a write driver) 140 performs various kinds of control for a write operation (writing of data). The write circuit 140 supplies a write current to the memory cell string MS during the write operation, and thereby writes data into the memory element.

For example, the write circuit 140 has a voltage source (or a current source), a latch circuit, and others.

The read circuit (also referred to as a read control circuit or a read driver) 150 performs various kinds of control for a read operation (reading of data). The read circuit 150 controls a potential or a current value of the bit line BL during the read operation, and thereby reads data in the memory element.

For example, the read circuit 150 has a voltage source (or a current source), a latch circuit, a sense amplifier circuit, and others.

Note that the write circuit 140 and the read circuit 150 are not limited to circuits independent of each other. For example, the write circuit and the read circuit have mutually usable common components, and may be provided as one integrated circuit.

The I/O circuit (input/output circuit) 160 is an interface circuit used to transmit and receive various signals in the magnetic memory 1.

During the write operation, the I/O circuit 160 transfers, to the write circuit 140, data DT from the external device (e.g. the memory controller 5) as write data. During the read operation, the I/O circuit 160 transfers, to the external device, the data DT output to the read circuit 150 from the memory cell array 100, as read data.

The I/O circuit 160 transfers, to the decode circuit 130, the address ADR from the external device. The I/O circuit 160 transfers, to the control circuit 190, a command CMD from the external device. The I/O circuit 160 transmits and receives various control signals CNT between the control circuit 190 and the external device.

The voltage generation circuit 170 generates voltages for various operations of the memory cell array 100 by using a power supply voltage provided from the external device.

During the write operation, the voltage generation circuit 170 outputs various voltages generated for the write operation, to the write circuit 140. During the read operation, the voltage generation circuit 170 outputs various voltages generated for the read operation, to the read circuit 150.

The control circuit (also referred to as a state machine, a sequencer, or an internal controller) 190 controls the operation of each circuit in the magnetic memory 1 on the basis of the control signal CNT and the command CMD.

For example, the command CMD is a signal indicating an operation to be performed by the magnetic memory 1. For example, the control signal CNT is a signal intended to control an operation timing between the external device 5 or 900 and the magnetic memory 1, and an internal operation timing of the magnetic memory 1.

The control circuit 190 holds the control information LUT intended to control the write operation for the memory cell array 100. For example, the control circuit 190 includes an information holding circuit 191 to hold the control information LUT therein. The information holding circuit 191 is, for example, a register circuit.

Note that the information holding circuit 191 may be provided outside the control circuit 190.

The magnetic memory according to the present embodiment is, for example, an MRAM.

<Configuration Example of Memory Cell Strings>

An internal configuration of the memory cell string of the MRAM according to the present embodiment is described with reference to FIG. 3 and FIG. 4.

Figure 3:
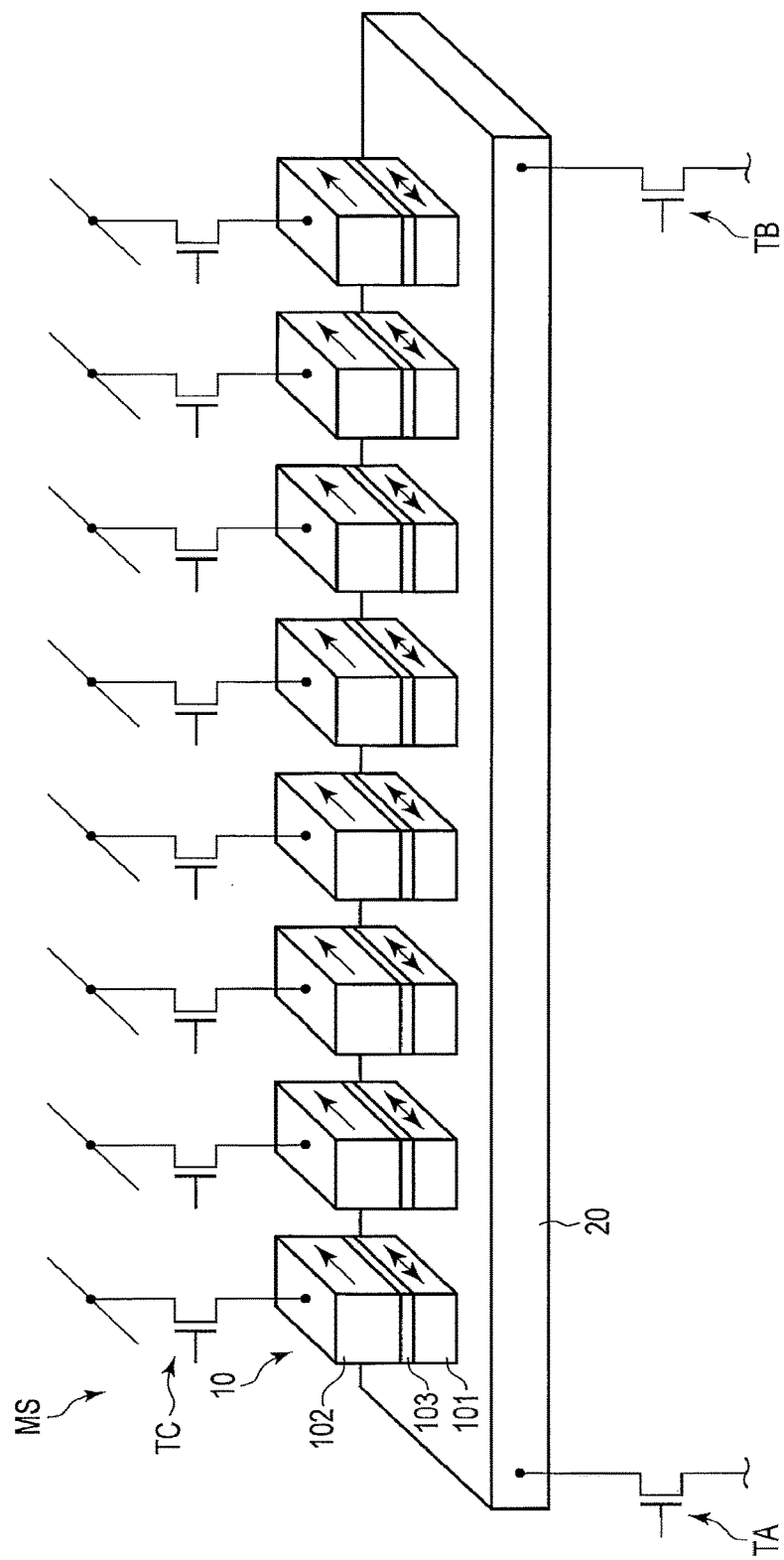
FIG. 3 is a bird's-eye view showing a configuration example of the magnetic memory according to the first embodiment.

FIG. 3 is a bird's-eye view illustrating a basic configuration of the memory cell string of the MRAM according to the present embodiment.

As shown in FIG. 3, the memory cell string MS includes the magnetoresistive effect elements 10 arranged on the electrode (interconnect, conductive layer) 20. The magnetoresistive effect elements 10 are electrically connected to the common electrode 20. Hereinafter, the electrode 20 is also referred to as the common electrode 20.

The magnetoresistive effect element 10 includes at least two magnetic layers 101 and 102, and a non-magnetic layer 103.

Each of the two magnetic layers 101 and 102 has magnetization. A direction of the magnetization of the magnetic layer 101 is variable. A direction of the magnetization of the magnetic layer 102 is invariable (in a fixed state).

In the present embodiment, the magnetic layer 101 whose magnetization direction is variable is referred to as a storage layer 101, and the magnetic layer 102 whose magnetization direction is invariable is referred to as a reference layer 102.

Note that in the present embodiment, that "the direction of the magnetization of the reference layer is invariable" or "the direction of the magnetization of the reference layer is in a fixed state (e.g. is fixed)" means that when a current or a voltage indented to change the direction of the magnetization of the storage layer is supplied to the memory cell string, the direction of the magnetization of the reference layer is not changed by the supplied current or voltage.

For example, the magnetic layers 101 and 102 have in-plane magnetic anisotropy (parallel magnetic anisotropy). Easily magnetizable axis directions of the magnetic layers 101 and 102 are parallel to their layer surfaces. The easily magnetizable axis directions of the magnetic layers 101 and 102 are perpendicular to a stacking direction of the magnetic layers 101 and 102. For example, the easily magnetizable axis directions of the magnetic layers 101 and 102 are set to directions crossing an arrangement direction of the magnetoresistive effect elements 10 (a longitudinal direction of the common electrode 20).

The non-magnetic layer 103 is provided between the two magnetic layers 101 and 102. The non-magnetic layer 103 functions as a tunnel barrier layer 103. For example, the tunnel barrier layer 103 is an insulating layer having magnesium oxide. The tunnel barrier layer 103 is an extremely thin insulating film through which a tunnel current flows.

The storage layer 101 is provided on the electrode 20. The reference layer 102 is stacked on the storage layer 101 via the tunnel barrier layer 103. In the present embodiment, the magnetization direction of the reference layer 102 is set to a direction from a near side of the sheet toward a far side of the sheet in FIG. 3.

For example, a magnetic tunnel junction is formed by the two magnetic layers 101 and 102 and the tunnel barrier layer 103. In the present embodiment, the magnetoresistive effect element 10 having the magnetic tunnel junction is referred to as an MTJ element 10.

A resistance value (resistance state) of the MTJ element 10 changes in accordance with a relation (magnetization arrangement) between the magnetization direction of the storage layer 101 and the magnetization direction of the reference layer 102. For example, the MTJ element 10 can take a first resistance state or a second resistance state.

For example, the MTJ element 10 has a rectangular-parallelepiped structure, and has a rectangular plane shape. Note that the MTJ element 10 may have an elliptic plane shape.

To control the operation of the memory cell string MS, transistors TA, TB, and TC are connected to the memory cell string MS.

For example, a current path (source/drain) of the transistor TA is connected to one end of the electrode 20 in the longitudinal direction (extending direction, the arrangement direction of the MTJ elements) of the electrode 20. A current path of the transistor TB is connected to the other end of the electrode 20 in the longitudinal direction of the electrode 20.

The transistors TC are provided to correspond to the MTJ elements 10 one to one. Current paths of the transistors TC are connected to the reference layer 102 of the corresponding MTJ element 10.

FIG. 4 is an equivalent circuit diagram showing an example of the memory cell array including the memory cell string of the MRAM according to the present embodiment.

As shown in FIG. 4, the memory cell strings MS are provided in the memory cell array 100. The memory cell strings MS are arranged in a Y-direction.

The memory cell array 100 includes the common electrodes (interconnects, electrically conductive layers) 20 (20-1, . . . , and 20-m). The common electrodes 20 are separated by the respective memory cell strings MS. One memory cell string MS includes one common electrode 20.

The memory cell array 100 includes interconnects 25 (25-1, 25-2, . . . , and 25-n) and 29 (29-1, 29-2, . . . , and 29-n). The interconnects 25 and 29 are commonly connected to the memory cell strings MS arranged in the Y-direction.

In the memory cell string MS, the MTJ elements 10 (10-1, 10-2, . . . , and 10-n) are connected to the common electrode 20 (20-1, . . . , and 20-m). m and n are integers of 1 or more. The MTJ elements 10 are arranged in an X-direction.

One end of the MTJ element 10 is connected to the common electrode 20. The other end of the MTJ element 10 is connected to corresponding one of the interconnects 25 via the current path (source/drain) of the transistor TC. A gate of the transistor TC is connected to corresponding one of the interconnects 29.

The memory cell array 100 includes interconnects 23 and 24. The memory cell array 100 includes the transistors TA (TA-1, . . . , and TA-m) to correspond to the memory cell strings MS. The memory cell array 100 includes the transistors TB (TB-1, . . . , and TB-m) to correspond to the memory cell strings MS.

The interconnect 23 and 24 are commonly connected to the memory cell strings MS. The interconnect 23 is connected to one end of the common electrode 20 via the current path of the transistor TA. The interconnect 24 is connected to the other end of the common electrode 20 via the current path of the transistor TB.

The memory cell array 100 includes interconnects 21 (21-1, . . . , and 21-m). The interconnects 21 are provided for the respective memory cell strings MS. The interconnect 21 is connected to gates of the transistors TA and TB of the corresponding memory cell string MS.

The transistors TA, TB, and TC function as elements which activate (select) the memory cell strings MS and the MTJ elements (memory cells) 10.

The transistors TA and TB are turned on or off by control of potentials of the interconnects 21. Thereby, one of the memory cell strings MS (e.g. one or more rows) is selected.

The transistor TC is turned on or off by control of a potential of the interconnect 29. Thereby, a column (one or more columns) of the memory cell array 100 is selected.

The supply of a current (or a voltage) to the common electrode 20 is controlled by control of potentials (sources/sinks of a current) of the interconnects 23 and 24. For example, in accordance with a direction of a current passed through the common electrode 20, one of the two interconnects 23 and 24 is set to a high-potential side (e.g. a positive potential, a current source side), and the other is set to a low-potential side (e.g. a ground voltage, a current sink side).

A voltage having a predetermined polarity and voltage value is applied to the reference layer 102 of the MTJ element 10 by control of a potential of the interconnect 25.

Each interconnect is controlled by the row control circuit 110, the column control circuit 120, the write circuit 140, and the read circuit 150 in accordance with an operation to be executed.

Note that the configuration of the memory cell array 100 using the memory cell strings MS is not limited to the example shown in FIG. 4.

(2) Principles

Various principles of achieving functions as the memory device in the MRAM according to the present embodiment are described with reference to FIG. 5 to FIG. 10.

<Magnetoresistive Effect>

Figure 5:
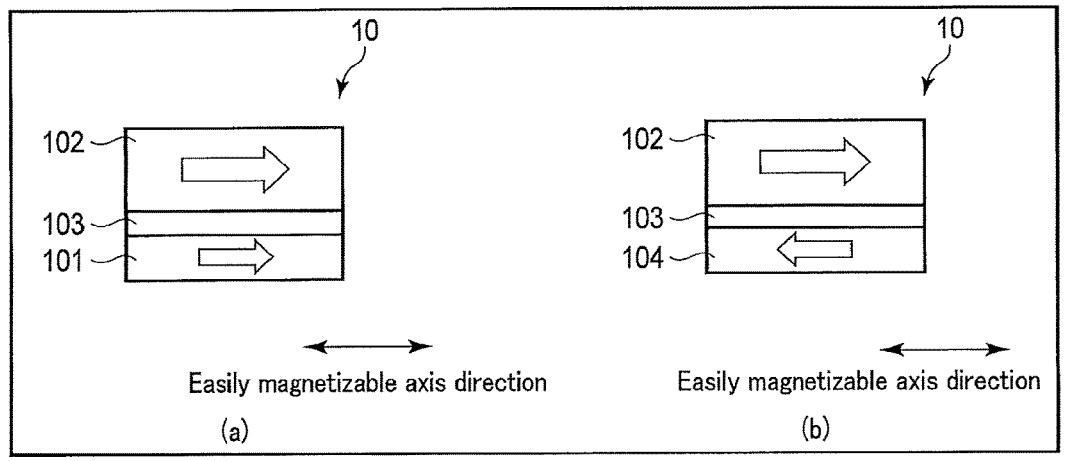
FIG. 5 is a diagram illustrating principles of the magnetic memory according to the first embodiment.

FIG. 5 is a diagram illustrating the magnetoresistive effect element as the memory element in the MRAM according to the present embodiment.

(a) of FIG. 5 is a diagram schematically showing a magnetization arrangement state of the magnetoresistive effect element in the case where the magnetoresistive effect element has a first resistance state. (b) of FIG. 5 is a diagram schematically showing a magnetization arrangement state of the magnetoresistive effect element in the case where the magnetoresistive effect element has a second resistance state.

As described above, the magnetic layers 101 and 102 have the in-plane magnetic anisotropy (parallel magnetic anisotropy). The magnetization directions (easily magnetizable axis directions) of the magnetic layers 101 and 102 are substantially parallel to the layer surfaces of the magnetic layers. The magnetization directions of the magnetic layers 101 and 102 are substantially perpendicular to the stacking direction of the layers 101, 102, and 103. For example, the in-plane magnetic anisotropy of the magnetic layers 101 and 102 results from a shape magnetic anisotropy or the like of the magnetic layers. Hereinafter, the MTJ element using the in-plane magnetic anisotropy of the magnetic layer is referred to as an in-plane magnetization type MTJ element (or a parallel magnetization type MTJ element).

The resistance state of the MTJ element (magnetoresistive effect element) 10 changes in accordance with a relation between the magnetization direction of the storage layer 101 and the magnetization direction of the reference layer 102 (magnetization arrangement).

As shown in (a) of FIG. 5, when the magnetization direction of the storage layer 101 is the same as the magnetization direction of the reference layer 102, the MTJ element 10 has the first resistance state (first magnetization arrangement state). The MTJ element 10 having the first resistance state has a resistance value Rp.

As shown in (b) of FIG. 5, when the magnetization direction of the storage layer 101 is opposite to the magnetization direction of the reference layer 102, the MTJ element 10 has the second resistance state (second magnetization arrangement state). The MTJ element 10 having the second resistance state has a resistance value Rap. The resistance value Rap is higher than the resistance value Rp.

Thus, the MTJ element 10 can take one of the low resistance state or the high resistance state in accordance with the magnetization arrangement of the two magnetic layers 101 and 102.

A magnetoresistive effect is a phenomenon in which a resistance value is changed by such a relation between the magnetization directions of the two magnetic layers 101 and 102.

For example, the MTJ element 10 holds one-bit data ("0" data and "1" data). In this case, when the resistance state of the MTJ element 10 is set to the first resistance state, a memory cell MC is set to a first data holding state (e.g. a "0" data holding state). When the resistance state of the MTJ element 10 is set to the second resistance state, the memory cell MC is set to a second data holding state (e.g. a "1" data holding state).

In the present embodiment, the magnetization arrangement state in which the magnetization direction of the storage layer 101 and the magnetization direction of the reference layer 102 in the MTJ element 10 are the same is referred to as a parallel state (or P state). The magnetization arrangement state in which the magnetization direction of the storage layer 101 and the magnetization direction of the reference layer 102 in the MTJ element 10 are opposite is referred to as an antiparallel state (or AP state).

As below, in the MRAM according to the present embodiment, a spin Hall effect or a voltage effect is used to control the magnetization arrangement (P/AP state) of the MTJ element 10.

<Spin Hall Effect>

The spin Hall effect used in the MRAM according to the present embodiment is described with reference to FIG. 6.

Figure 6:
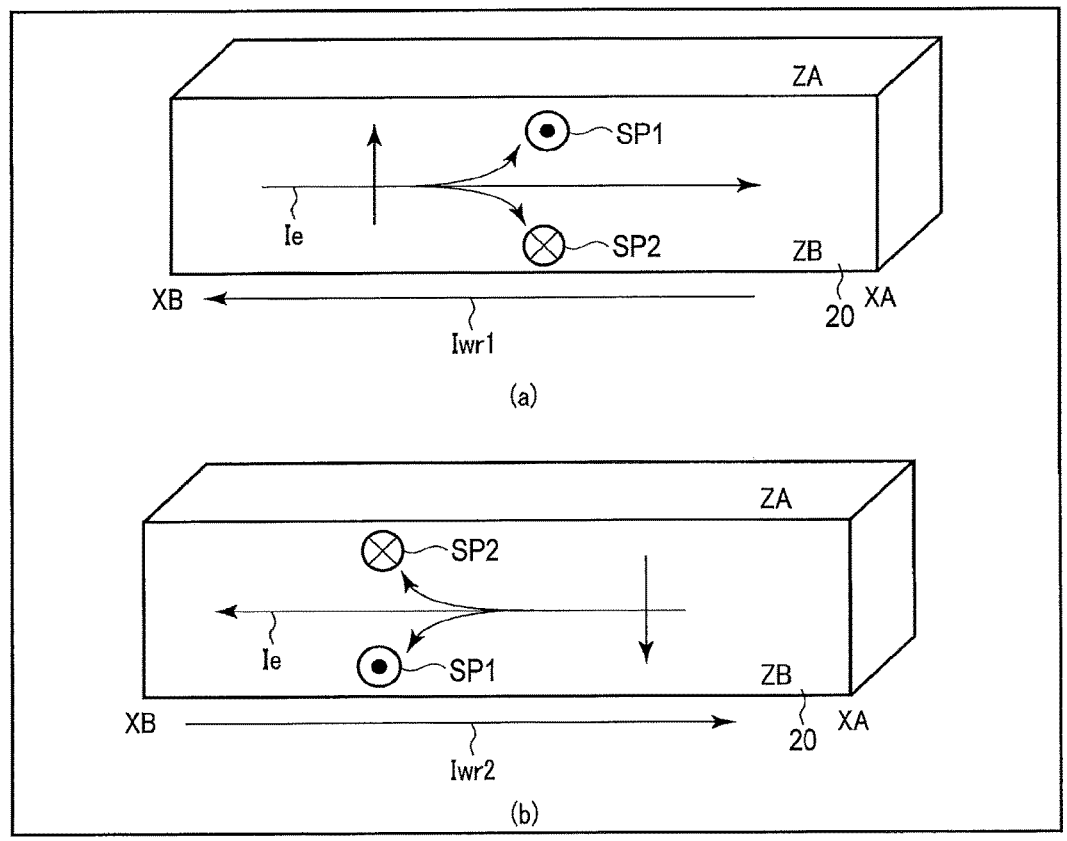
FIG. 6 is a diagram illustrating the principles of the magnetic memory according to the first embodiment.

(a) and (b) of FIG. 6 are schematic diagrams illustrating the spin Hall effect.

In the MRAM according to the present embodiment, the spin Hall effect (or also referred to as spin orbit torque: SOT) is used for magnetization switching of the storage layer of the MTJ element 10.

For example, a material having spin orbit interaction is used to develop the spin Hall effect.

In (a) and (b) of FIG. 6, the common electrode (conductive layer, interconnect) 20 is made of a material having great spin orbit interaction. For example, the common electrode 20 is a layer made of at least one material selected from the group consisting of tantalum (Ta), tungsten (W), platinum (Pt) and the other. Hereinafter, the common electrode 20 is also referred to as a spin orbit interaction layer.

A current Iwr (Iwr1, Iwr2) is supplied to the common electrode 20. The current (write current) Iwr includes a charge (electron) having an upspin SP1 and a charge having a downspin SP2.

When the current Iwr flows through the common electrode 20, the upspin SP1 and the downspin SP2 are scattered in opposite directions in accordance with the flowing direction of the current (the direction of the spin).

A relation between a spin (represented as "S"), a spin flow (represented as "Is"), and an electron flow (represented as "Ie") is represented by (Equation A) below. Note that the direction of the electron flow "Ie" is opposite to the flowing direction of the current. "S" is a vector.

$$Is \propto S \times Ie \quad \text{(Equation A)}$$

As shown in (Equation A), the spin flow "Is" is proportional to an outer product of the spin "S" and the electron flow "Ie".

As a result, the spin flow "Is" occurs in the common electrode 20 having the spin orbit interaction. Such a phenomenon whereby the spin flow Is occurs is the spin Hall effect.

For example, as shown in (a) of FIG. 6, when the current Iwr1 flows from an "XA" side (right side) to an "XB" side (left side) of the common electrode 20 in the drawing, the upspin SP1 is scattered to a "ZA" side of the common electrode 20 (a front side of the common electrode 20), and the downspin SP2 is scattered to a "ZB" side of the common electrode 20 (a back side of the common electrode 20).

As shown in (b) of FIG. 6, when the current Iwr2 flows from the "XB" side to the "XA" side of the common electrode 20 in the drawing, the upspin SP1 is scattered to the "ZB" side of the common electrode 20, and the downspin SP2 is scattered to the "ZA" side of the common electrode 20.

For example, the MTJ element 10 is provided on the "ZA"-side surface of the common electrode 20.

As shown in (a) and (b) of FIG. 6, the direction of spin torque acting on the storage layer 101 of the MTJ element 10 on the common electrode 20 is inverted by inversion of the polarity of the current Iwr (the flowing direction of the current) passed through the common electrode 20.

As shown in FIG. 3, the MTJ element 10 is disposed on the common electrode 20, whereby the spin orbit torque (SOT) resulting from the spin flow generated by the spin Hall effect is applied to the MTJ element 10.

The direction of the spin acting on the storage layer 101 as the spin orbit torque changes in accordance with the direction of the current Iwr flowing through the common electrode 20.

It is therefore possible to control the direction of the magnetization of the storage layer 101 to a direction parallel or antiparallel to the direction of the magnetization of the reference layer 102 by controlling the direction of the current Iwr flowing through the common electrode 20.

Thus, in the MRAM according to the present embodiment, the direction of the magnetization of the storage layer 101 of the MTJ element 10 can be changed (switched, inverted) by the spin Hall effect in accordance with the direction of the applied spin.

The MRAM using the spin Hall effect can write data into the MTJ element 10 without directly passing a current through the tunnel barrier layer 103.

Hence, breakage of the tunnel barrier layer 103 can be inhibited in the MRAM using the spin Hall effect.

Furthermore, in the MRAM using the spin Hall effect, a path of a current in the write operation is different from a path of a current in the read operation. Therefore, substantially no read disturb occurs in the MRAM using the spin Hall effect.

In a structure in which MTJ elements 10 are disposed on one common electrode 20 as in FIG. 3, the write operation can be collectively performed for MTJ elements owing to the spin Hall effect.

This enables reduction of write energy (e.g. power consumption) per bit and cell size shrinkage in the MRAM according to the present embodiment.

In the configuration in FIG. 3, when the current Iwr is passed through the common electrode 20, there may be an element (selected element) into which data are written and an element (unselected element) into which no data are written, in the MTJ elements 10 on the common electrode 20. The selected element is the MTJ element in which the magnetization of the storage layer should be switched (inverted) during the write operation. The unselected element is the MTJ element in which the magnetization of the storage layer is not switched (not inverted) during the write operation.

As below, the MRAM according to the present embodiment controls whether or not to write data into the MTJ elements 10 on the common electrode 20 by voltage-controlled magnetic anisotropy (VCMA).

<Voltage Effect>

The voltage effect of the magnetoresistive effect element in the MRAM according to the present embodiment is described with reference to FIG. 7.

The voltage effect is a phenomenon in which perpendicular magnetic anisotropy of the storage layer 101 is changed by the application of a voltage across the storage layer 101 and the reference layer 102 of the MTJ element 10.

An energy barrier between the parallel state (P state) and the antiparallel state (or AP state) in the MTJ element 10 is changed by the change of the perpendicular magnetic anisotropy of the storage layer 101.

This makes it possible to control the increase and decrease of a magnetization switching current (magnetization switching threshold) Ic of the MTJ element resulting from the spin Hall effect.

For example, as shown in FIG. 7 (and FIG. 5), an in-plane magnetization film is used for the MTJ element 10. In the in-plane magnetization film, the directions of the magnetizations of the storage layer 101 and the reference layer 102 are parallel to the layer surfaces (film surfaces) of the magnetic layers 101 and 102.

In the MTJ element 10 using the in-plane magnetization film, a voltage VCNT is applied to the MTJ element 10 to increase perpendicular magnetic anisotropy energy of the storage layer 101 (bring the storage layer 101 closer to a perpendicular stable state), whereby the magnetization switching threshold Ic of the storage layer 101 is reduced.

On the contrary, if the perpendicular magnetic anisotropy energy of the storage layer 101 is decreased (in-plane magnetization is more stabilized) by the application of the voltage VCNT, the magnetization switching threshold Ic of the storage layer 101 increases.

Note that when a perpendicular magnetization film is used for the MTJ element, a relation between the perpendicular magnetic anisotropy energy and voltage in the MTJ element for which the perpendicular magnetization film is used is reverse to a relation between the perpendicular magnetic anisotropy energy and voltage in the MTJ element for which the in-plane magnetization film is used.

The increase or decrease of the magnetization switching threshold Ic resulting from voltage application is determined in accordance with a polarity of a voltage to be applied to the MTJ element.

For example, in an in-plane magnetization type MTJ element as one example, a CoFeB layer is used for a storage layer, and an MgO layer is used for a tunnel barrier layer.

As shown in (a) of FIG. 7, in the in-plane magnetization type MTJ element 10, when a voltage having a positive voltage value is applied to the storage layer 101, and the control voltage VCNT having a negative voltage value (or 0 V) is applied to the reference layer 102 (when a potential on the storage layer side is higher than a potential on the reference layer side), the magnetization switching threshold Ic of the storage layer 101 decreases.

As shown in (b) of FIG. 7, in the in-plane magnetization type MTJ element 10, when a voltage having a negative voltage value (or 0 V) is applied to the storage layer 101, and the voltage VCNT having a positive voltage value is applied to the reference layer 102 (when the potential on the reference layer side is higher than the potential on the storage layer side), the magnetization switching threshold Ic of the storage layer 101 increases.

When such a change of the magnetization switching threshold of the storage layer 101 by the voltage effect is used, the magnetization switching threshold Ic of the MTJ element which is targeted for writing (hereinafter referred to as a selected element) among the MTJ elements 10 arranged on the same electrode 20 is set to a value lower than a current value of a write current by a potential state in (a) of FIG. 7, and the magnetization switching threshold Ic of the MTJ element 10 which is not targeted for writing is set to a value higher than the current value of the write current by a potential state in (b) of FIG. 7.

The current value of the write current is set in consideration of a variation of the magnetization switching threshold resulting from the voltage effect, so that data can be selectively written into the MTJ elements 10 arranged on the same electrode 20.

The MRAM according to the present embodiment can control the writing of data into the MTJ elements 10 in the memory cell string MS.

<Write Operation>

The MRAM according to the present embodiment can perform the write operation as below on the basis of the phenomena/principles described above with reference to FIG. 5 to FIG. 7.

Figure 8:
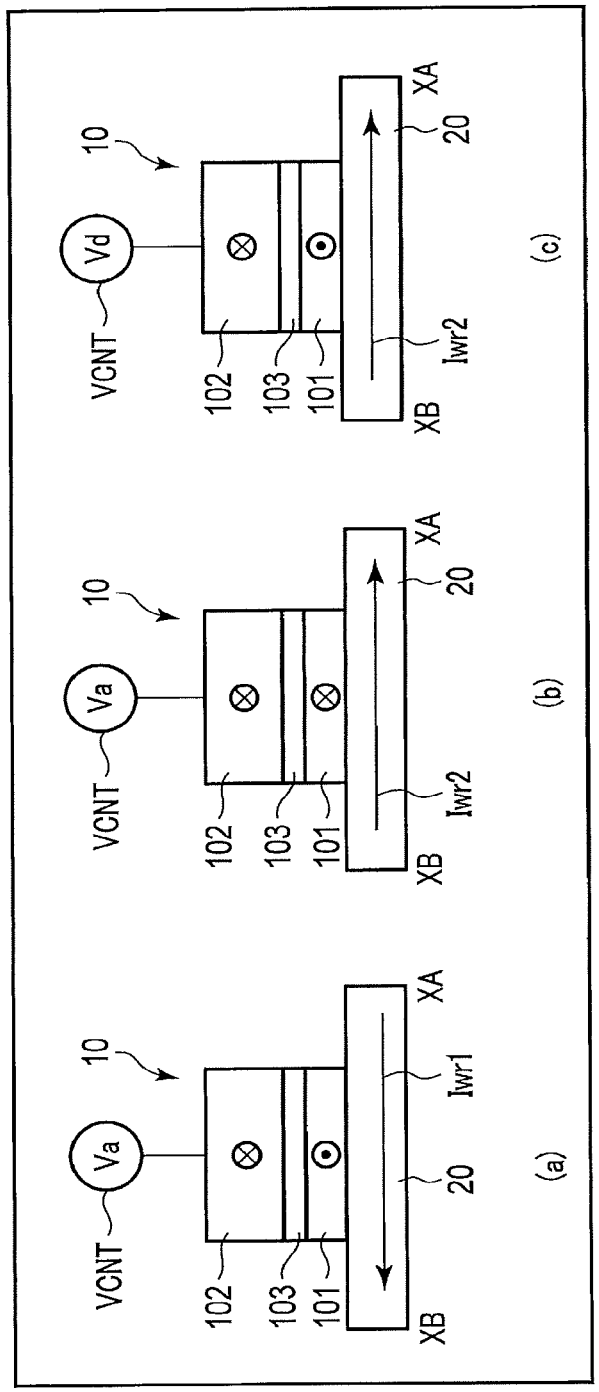
FIG. 8 is a diagram illustrating the principles of the magnetic memory according to the first embodiment.

FIG. 8 is a schematic diagram illustrating a basic example of the write operation by the MRAM according to the present embodiment.

The MRAM according to the present embodiment performs the write operation by a two-stage program (program step).

In the MRAM according to the present embodiment, when a value ("0" data and "1" data) of one-bit among 8-bit data are written into the corresponding MTJ element 10 in the memory cell string MS, the write operation includes a first program and a second program. One of the data "0" and "1" is written in the first program, and the other of the data "0" and "1" is written in the second program.

When 8 (8-bit) MTJ elements 10 are arranged on one electrode 20, the magnetization arrangement state of all of the 8 MTJ elements 10 is set to the AP state, for example, in the first program.

Specifically, a control voltage having a predetermined polarity and voltage value is applied to the 8 MTJ elements 10 so that the magnetization switching threshold Ic of the storage layers of all the MTJ elements 10 on the common electrode 20 decreases.

In a state where the magnetization switching threshold Ic of the storage layers 101 is decreased, a spin resulting from the spin Hall effect is applied to the MTJ elements 10 on the common electrode 20.

As shown in (a) of FIG. 8, when data corresponding to the AP state (e.g. "1" data) are written into the MTJ element 10, the control voltage VCNT having a negative voltage value Va is applied to the reference layer 102 of the MTJ element 10 so that the potential on the reference layer side of the MTJ element 10 is lower than the potential on the storage layer side.

For example, the write current Iwr1 is supplied to the common electrode 20 so that the write current Iwr1 flows from the XA side of the common electrode 20 to the XB side.

Thus, data corresponding to the AP state of the MTJ element 10 are collectively written into the MTJ element on the common electrode 20.

In the second program after the first program, data different from the data written in the first program are written into a predetermined MTJ element in accordance with 8-bit data to be written. Hereinafter, data including multiple bits are referred to as a data set.

When date writing corresponding to the AP state is performed in the first program, the MTJ element into which data corresponding to the P state should be written is set to a write target, and the element into which data corresponding to the AP state should be written (the MTJ element which should maintain the AP state) is set to a non-write target.

For example, a control voltage (selection voltage) VCNT having a predetermined polarity and voltage value is applied to the write target MTJ element (selected element) 10 among the MTJ elements 10 on the common electrode 20 so that the magnetization switching threshold Ic of the storage layer 101 decreases. In contrast, a control voltage (non-selection voltage) VCNT having a predetermined polarity and voltage value is applied to the non-write target MTJ element (unselected element) 10 among the MTJ elements 10 on the common electrode 20 so that the magnetization switching threshold Ic of the storage layer 101 increases.

In a state where the control voltages are applied to the selected and unselected MTJ elements, the write current Iwr2 is passed through the common electrode 20. The direction of the write current Iwr2 in the second program is opposite to the direction of the write current Iwr1 in the first program.

As shown in (b) of FIG. 8, when data (e.g. "0" data) corresponding to the P state are written into the MTJ element 10 (when the MTJ element 10 is set to the selected state), the control voltage (selection voltage) VCNT having the negative voltage value Va is applied to the reference layer 102 of the MTJ element 10 so that the potential on the reference layer side of the MTJ element 10 is lower than the potential on the storage layer side.

For example, the write current Iwr2 is supplied to the common electrode 20 so that the write current Iwr2 flows from the XB side of the common electrode 20 to the XA side.

As shown in (c) of FIG. 8, when no data are written into the MTJ element 10 (when the MTJ element 10 is set to an unselected state), the control voltage (non-selection voltage) VCNT having a positive voltage value Vd is applied to the reference layer 102 of the MTJ element 10 so that the potential on the reference layer side of the MTJ element 10 is higher than the potential on the storage layer side.

Consequently, even if the write current Iwr2 is flowing through the common electrode 20, writing of data (magnetization switching of the storage layer 101) does not occur in the unselected MTJ element 10.

Thus, in the second program, the magnetization arrangement of the write target MTJ element is selectively changed from the AP state to the P state among the MTJ elements 10 on the common electrode 20 by the spin Hall effect and the voltage effect, and the magnetization arrangement of the non-write target MTJ element is maintained.

As a result, in the MRAM according to the present embodiment, writing of data of all arrangement patterns of "1/0" that can be formed by the MTJ elements is enabled by a writing technique including the steps of the two programs.

Note that in the write operation in the MRAM according to the present embodiment, "1" data may be written in the first program, and "0" data may be written in the second program.

In the present embodiment, the memory which performs the write operation by these principles is referred to as a voltage control spintronic memory (VoCSM) or a voltage control magnetic memory.

Figure 9:
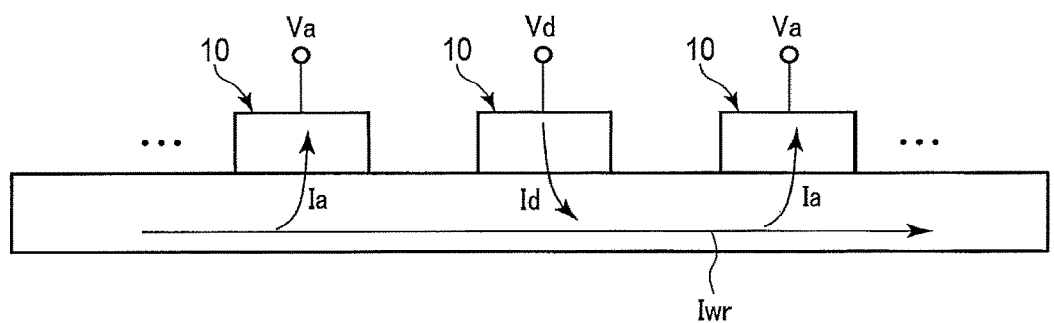
FIG. 9 is a diagram illustrating an operation example of the magnetic memory according to the first embodiment.

FIG. 9 is a diagram schematically showing a state during a write operation in the VoCSM type MRAM according to the present embodiment.

As shown in FIG. 9, when the application of the control voltage VCNT to the MTJ element 10 and the supply of the current Iwr to the common electrode 20 are performed at the same time as in the write operation in the MRAM according to the present embodiment, there is a possibility that a current Ia may flow from the common electrode 20 to the MTJ element 10 or a current Id may flow from the MTJ element 10 to the common electrode 20, depending on a potential difference between the MTJ element 10 and the common electrode 20.

Due to such currents Ia and Id flowing between the MTJ element 10 and the common electrode 20, there is a possibility that the current value of the write current Iwr may fluctuate in the common electrode 20.

Due to the currents Ia and Id flowing between the MTJ element 10 and the common electrode 20, there is a possibility that an effective current value of the write current acting on the MTJ element may change in accordance with data to be written and the position of the electrode.

Herein, the resistance value of the MTJ element 10 is represented as "Rx", and the control voltage applied to the MTJ element is represented as "Vx". The current value of the current resulting from the MTJ element 10 is represented as "Ix".

The current value Ix of the current resulting from the MTJ element 10 has a relation Ix=Vx/Rx. Due to the current resulting from one MTJ element 10, the current value of the write current Iwr increases or decreases in accordance with the current value Ix.

When N MTJ elements 10 are provided on one common electrode 20, a fluctuation of I×X(N−1) occurs as a maximum value in the current value of the write current Iwr. N is a natural number of 2 or more.

Hereinafter, a write current having a fluctuation of the current value resulting from the current flowing between the MTJ element and the electrode is referred to as an effective write current. The effective write current is a current affected by the current flowing between the MTJ element and the electrode.

Note that the write circuit 140 outputs a write current having a current value which is a certain set value (initial value). There is a possibility that the current value of the effective write current may fluctuate from the current value of the write current output from the write circuit 140 due to the current flowing between the MTJ element and the electrode.

The fluctuation of the write current Iwr is preferably decreased to widen a write window of the memory. One way of decreasing the fluctuation of the write current is to increase the resistance value of the MTJ element 10 so that the fluctuation of the write current Iwr can be reduced.

However, when the resistance value of the MTJ element 10 is increased, there is a possibility that a time of reading data from the MTJ element 10 may increase.

In the present embodiment, the magnetic memory 1 as the VoCSM can inhibit the effect of the fluctuation of the write current resulting from the application of the voltage to the MTJ element 10, by principles and control described below.

Figure 10:
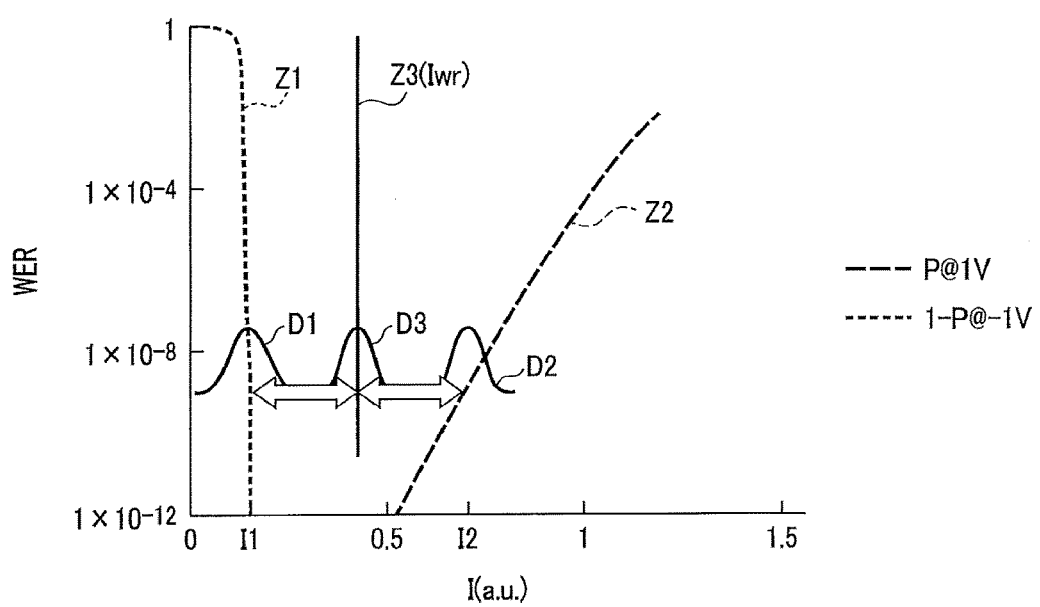
FIG. 10 is a graph illustrating an operation example of the magnetic memory according to the first embodiment.

FIG. 10 is a schematic diagram illustrating the write window of the magnetic memory (e.g. the VoCSM).

In FIG. 10, a horizontal axis of the graph corresponds to the current I, and a vertical axis of the graph corresponds to a write error rate (WER).

A curve Z1 corresponding to "1-P" is an error curve indicating a non-switching probability of the selected element during writing (during programming). Hereinafter, an error whereby magnetization switching of the selected element does not occur is simply referred to as a write error (or a program failure). In the selected element, a control voltage VCNT of, for example, −1 V is applied to the reference layer side of the MTJ element 10 as the selection voltage so that the energy barrier of the magnetization switching decreases due to the voltage effect. Accordingly, the magnetization switching threshold of the storage layer is reduced. As a result, the write error (non-switching of magnetization, program failure) in the selected element is inhibited.

Therefore, an error curve (1-P) Z1 shifts to a low current side.

A curve Z2 corresponding to "P" is an error curve indicating a switching probability of the unselected element during writing. Hereinafter, an error whereby magnetization switching of the unselected element occurs is referred to as erroneous writing (or an erroneous write error).

In the unselected element, a control voltage VCNT of, for example, +1 V is applied to the reference layer side of the MTJ element 10 as the non-selection voltage so that the energy barrier of the magnetization switching increases due to the voltage effect. Accordingly, the magnetization switching threshold of the storage layer is increased. As a result, the erroneous writing (unintended switching of magnetization) in the unselected element is inhibited.

Therefore, an error curve (P) Z2 shifts to a higher current side than the error curve Z1.

The write current Iwr is set so that a window (difference) is made between these two error curves Z1 and Z2 by the voltage effect of the MTJ element. For example, when a 1-bit error rate WER is set to 1×10⁻⁹, the switching current of the selected element is set at a current value of "I1" in FIG. 10, and a disturb current (a current whereby a non-switching element is erroneously switched) of the unselected element is set at a current value of "I2" in FIG. 10. Each of the current values I1 and I2 is set so that the current value I2 is adequately higher than the current value I1 due to the voltage effect.

As indicated by a line Z3 in FIG. 10, the current value of the write current Iwr is set between the current value I1 and the current value I2.

As shown in FIG. 10, the current value I1 and the current value I2 include distributions D1 and D2 resulting from characteristic variations of the MTJ elements. The write current Iwr also includes a distribution D3 due to the fluctuation of the current resulting from the control voltage of the MTJ element for the voltage effect in addition to a circuit variation.

In the memory device, at least 6σ or more windows are preferably secured for the write current as evaluation indices of reliability in consideration of the sum of the above variations. Thus, it is preferable to adequately reduce the variation of the write current Iwr.

Note that if a window for writing can be secured without even the application of the control voltage for the voltage effect to the unselected element, the application of the control voltage to the unselected element may be omitted.

Further, in FIG. 10, a case where the 1-bit error rate is set to 1×10⁻⁹ is illustrated as one example of window setting. However, an error rate to be required changes depending on the purpose of the memory.

A model equation of the error curve is represented by the following equation (Equation B).

$$P=1-\exp(-f_0 \times t \times \exp(-\Delta \times (1-I/I_{c0})^2))$$ (Equation B)

wherein "$f_0$" is an attempt frequency. For example, 1×10⁹ Hz is used for "$f_0$". "t" is a pulse width of the write current Iwr. For example, the pulse width is set at 20 nsec. "$\Delta$" indicates retention energy (stability index) of the MTJ element. For example, "$\Delta$" is set at 70. "$I_{c0}$" indicates a critical current (magnetization switching threshold) for the magnetization switching of the MTJ element resulting from the spin Hall effect. The value of "$I_{c0}$" changes depending on the voltage effect (the magnitude of the control voltage) of the MTJ element.

As described above, there are two combinations of the magnetization arrangement state (parallel/antiparallel) of the MTJ element and data (0/1). For example, "0" data is associated with the P state of the MTJ element, and "1" data is associated with the AP state of the MTJ element.

In the present embodiment, the VoCSM type magnetic memory (e.g. MRAM) writes data (data set) into the 8 MTJ elements on the same common electrode 20 by, for example, two data writings (programs).

In this write sequence, data of the same value ("0" or "1") are written into all the MTJ elements 10 in the memory cell string MS in the first program.

Thus, in the first program, all the MTJ elements 10 in the memory cell string MS become selected elements of the program (writing), and there are no unselected elements. Therefore, in the first program, the current value I2 regarding an occurrence probability of erroneous writing in the unselected elements in FIG. 10 does not need to be set.

As a result, in the magnetic memory according to the present embodiment, it is possible to secure a relatively large write window by setting a higher value of the write current Iwr.

In the second program, generally, a program including the selected elements and the unselected elements (writing of a data set in which "1" data and "0" data are mixed) is performed. Thus, write conditions for the memory cell string MS are preferably set in consideration of a current value Id of the disturb current of the unselected elements as well.

A write operation in the VoCSM type MRAM according to the present embodiment is described below with regard to write conditions in the second program.

(3) Operation Examples

Operation examples of the magnetic memory (e.g. VoCSM type MRAM) according to the present embodiment are described with reference to FIG. 11 to FIG. 13.

(3a) Example 1

Conditions suited to the write operation (program) changes depending on a data set (an arrangement pattern of "1" and "0") to be written into the memory cell string.

When all the values of write data for all (here, 8) the MTJ elements 10 in the memory cell string MS are the same, for example, when all the bits of the write data are 0 (the data set is "00000000"), "0" data is written into all the MTJ elements in the first program. Accordingly, writing of the data (data set) is finished without the presence of unselected elements.

In this case, because unselected elements are not present in the memory cell string MS, there is no occurrence of a problem of write disturb (magnetization switching of unselected elements).

When all the bits of the write data are "1" (the data set is "11111111"), "1" data is written into all the MTJ elements in the first program. Accordingly, writing of the data is finished without the presence of unselected elements.

Thus, in the MRAM according to the present embodiment, writing of the data set "11111111" can be finished without the occurrence of write disturb, as in the case of writing of the data set "00000000".

Therefore, when the same data is written into all the MTJ elements, a highest possible current value of the write current has only to be set such that occurrence of a write error in the selected element can be inhibited.

As a result, in the writing of data in Example 1, the MRAM according to the present embodiment can reduce errors in writing of data.

(3b) Example 2

One example of the write operation in the MRAM according to the present embodiment is described with reference to FIG. 11.

Figure 11:
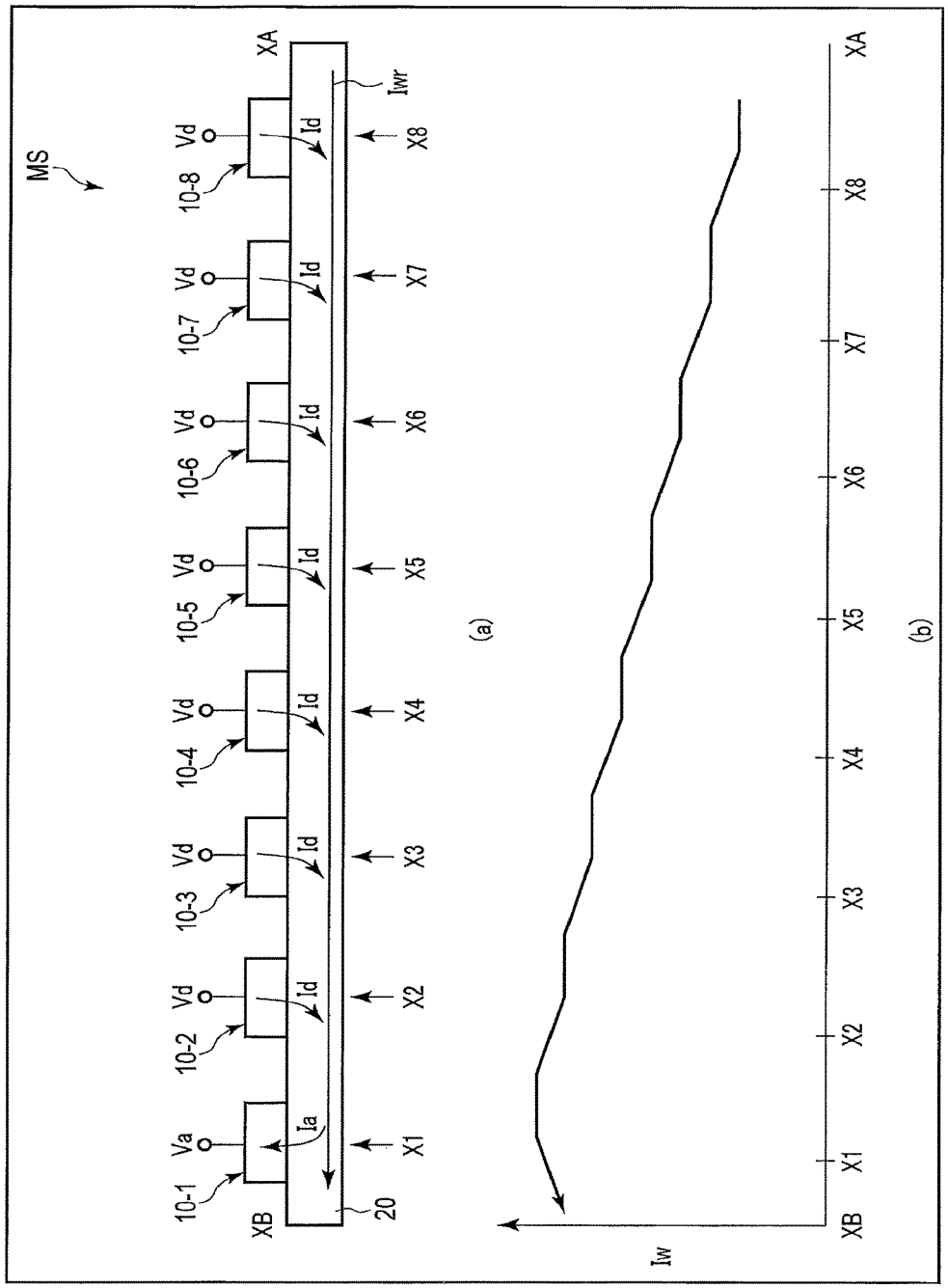
FIG. 11 is a diagram illustrating an operation example of the magnetic memory according to the first embodiment.

Described is a write operation in the VoCSM type MRAM according to the present embodiment when write data for the MTJ element at one end in the memory cell string MS are different from write data for the other MTJ elements in FIG. 11.

(a) of FIG. 11 is a diagram schematically showing a concept of the flow of a current in a memory cell string during the second program of the write operation.

When a write data set is "10000000", for example, "0" is programmed into all the MTJ elements 10 in the memory cell string MS in the first program. In the first program, all the MTJ elements 10 in the memory cell string MS become selected elements.

In the programming of "0", the write current Iwr2 is supplied to the common electrode 20 in a state where a control voltage having the voltage value Va is applied to all the MTJ elements 10 in the memory cell string MS so that the magnetization switching threshold Ic of the storage layer is lowered.

In the second program, as a target for writing of "1", the first MTJ element 10-1 (the element at the left end in (a) of FIG. 11) is set to a selected element, and the other second to eighth MTJ elements 10-2 to 10-8 are set to unselected elements.

Therefore, the control voltage having the voltage value Va is applied to the selected element (first MTJ element) 10-1 to lower the magnetization switching threshold Ic of the storage layer of the selected element. In contrast, the control voltage having the voltage value Vd is applied to the unselected elements (second to eighth MTJ elements) 10-2 to 10-8 to raise the magnetization switching threshold Ic of the storage layers of the unselected elements.

In a state where control voltages Va and Vd are respectively applied to the selected element and the unselected elements, the write current Iwr1 is supplied to the common electrode 20 to write "1" data.

As shown in (a) of FIG. 5, a negative voltage is applied to the reference layer of the MTJ element regarding the selected element 10-1, and a positive voltage is applied to the reference layers of the MTJ elements regarding the unselected elements 10-2 to 10-8. The write current Iwr1 used to write "1" data flows from the XA side (the MTJ element 10-8 side) of the electrode 20 to the XB side (the MTJ element 10-1 side).

In this case, in the selected element 10-1, the current Ia flows from the common electrode 20 to the MTJ element 10, so that the current value of the write current Iwr1 in a part (position) X1 in the vicinity of the selected element 10-1 decreases.

On the other hand, in the unselected elements 10-2 to 10-8, the current Id flows from the MTJ elements 10 to the common electrode 20, so that the current value of the write current Iwr1 increases at positions (parts of the electrode 20) X2 to X8 in the vicinity of the unselected elements.

(b) of FIG. 11 is a diagram schematically showing the change of the, current value of the write current at each position of the common electrode in (a) of FIG. 11.

As shown in (b) of FIG. 11, the current value of the write current Iwr1 increases or decreases at each of the positions X1 to X8 of the electrode 20 in accordance with the voltage values Va and Vd of the control voltages applied to the MTJ elements 10.

Herein, 7 unselected elements from the second MTJ element 10-2 to the eighth MTJ element 10-8 are present on the common electrode 20. Regarding the unselected elements, erroneous writing probability (magnetization switching) in the unselected elements is higher in the MTJ elements present at the positions where the current value of the write current Iwr1 is higher.

The current value of the write current Iwr1 is the highest in the vicinity of the position X2 of the second MTJ element 10-2 among the seven unselected elements in (b) of FIG. 11. The current value of the write current for the second MTJ element 10-2 is higher than the current value of the write current for the other unselected MTJ elements 10-3 to 10-8.

Note that in the memory cell string MS, the second MTJ element 10-2 is adjacent to the first MTJ element 10-1 which is the selected element. The second MTJ element 10-2 is located at a farthest position from a supply source side (XA side) of the write current Iwr1.

In the unselected elements in one memory cell string MS, the current value of the write current Iwr1 is the highest at the position of the second MTJ element 10-2, so that the occurrence probability of erroneous writing in the second MTJ element 10-2 is higher than the occurrence probability of erroneous writing in the other unselected MTJ elements 10-3 to 10-8.

In the second program, when the MTJ element (first MTJ element) 10-1 at one end of the memory cell string alone is a selected element, sufficient reduction of the occurrence probability of erroneous writing in the second MTJ element (the unselected element adjacent to the selected element at one end) 10-2 enables reduction of an erroneous writing rate in the unselected elements in the memory cell string MS.

The current value of the write current acting on the third to eighth MTJ elements 10-3 to 10-8 is lower than the current value of the write current acting on the second MTJ element.

If the erroneous writing rate of the second MTJ element can be sufficiently held down by an adjustment of the write current, the erroneous writing rate of the third to eighth MTJ elements 10-3 to 10-8 as the other unselected elements is lower than the erroneous writing rate of the second MTJ element 10-2, and therefore does not matter.

For example, as shown in FIG. 11, write conditions for the first MTJ element (selected element) 10-1 are preferably set to be suitable conditions (e.g. optimum conditions) for the inhibition of erroneous writing in the second MTJ element (unselected element) 10-2.

Herein, the suitable conditions for the inhibition of erroneous writing in the MTJ element as the unselected element are conditions in which the current value of the effective write current Iwr flowing through the electrode part of the unselected element is set in the vicinity of an average value of the current value I1 and the current value I2, as indicated by a line Z3 in FIG. 10.

Hereinafter, a condition of one or more parameters of the write current that can inhibit a write error (at least one of a program failure and erroneous writing) during the write operation regarding the unselected elements and the selected element is referred to as an error inhibition condition.

In the example of FIG. 11, the current value of the write current Iwr on the supply source XA side (herein, the eighth MTJ element side) is set so that at least the current value of the write current Iwr in the second MTJ element (the MTJ element next to the selected element) 10-2 is between the current value Id and the current value Ia.

At least one of the initial value and pulse width of the write current Iwr is adjusted so that the write current Iwr is set to the suitable conditions for the inhibition of erroneous writing in the unselected element.

The control of the pulse width of the write current Iwr corresponds to the control of the value of "t" in (Equation B) above. For example, expansion of the pulse width of the write current Iwr is equivalent to an increase of "t" in (Equation B).

When the pulse width of the write current is increased in a state where the current value of the write current is not changed, a magnetization switching probability resulting from the spin Hall effect increases. As a result, the current value I1 and the current value I2 shift toward a decrease (the left side of FIG. 10).

Note that when the pulse width of the write current is decreased in a state where the current value is not changed, the current value I1 and the current value I2 shift toward an increase (the right side of FIG. 10).

Owing to the adjustment of the pulse width of the write current Iwr, the conditions of the write current can be set suitably to the error inhibition condition of the unselected element (herein, the second MTJ element) in which the current value of the effective write current is the highest.

In the memory cell string MS, the selected element is the first MTJ element 10-1 alone. As shown in (b) of FIG. 11, the current value of the write current Iwr for the first MTJ element 10-1 is substantially the same as the current value of the write current for the second MTJ element 10-2.

Therefore, in the adjacent two MTJ elements 10-1 and 10-2, if the current value of the write current for the second MTJ element (unselected element) 10-2 is set to the error inhibition condition, the write error rate (probability of an error whereby magnetization is not switched) in the first MTJ element (selected element) 10-1 becomes sufficiently lower.

Note that even when the eighth MTJ element 10-8 is a selected element and the first to seventh MTJ elements 10-1 to 10-7 are unselected elements, errors in the write operation can be inhibited by the adjustment of at least one of the write current and the pulse width of the write current substantially as in the example of FIG. 11.

Thus, in the VoCSM type MRAM according to the present embodiment, the fluctuation of the write current resulting from the application of the control voltage to the MTJ element is taken into consideration by the control of the parameter (e.g. the pulse width) of the write current.

This enables both the inhibition of write errors in the selected element and the inhibition of erroneous writing in the unselected element.

As a result, in the writing of data in Example 2, the MRAM according to the present embodiment can reduce errors in the writing of data.

(3c) Example 3

A write operation of a general data set in which the arrangement of "0" and "1" is random in write data for the MTJ elements in the memory cell string is described with reference to FIG. 12 and FIG. 13.

In the present example, a data set "01001000" is used as one example of write data.

When the data set "01001000" is written into the eight MTJ elements 10 on one common electrode 20, there are two patterns of write operations.

In one pattern of write operation (herein, referred to as a first write method), "0" data is written into all the MTJ elements in the first program, and "1" data is written into two MTJ elements (the second and fifth MTJ elements) in the second program.

In the other pattern of write operation (herein, referred to as a second write method), "1" data is written into all the MTJ elements in the first program, and "0" data is written into six MTJ elements (the first, third, fourth, sixth, seventh, and eighth MTJ elements) in the second program.

<Write Operation of First Write Method>

An example in which "1" data is programmed after programming of "0" data regarding the write operation of the data set "01001000" is described with reference to FIG. 12.

In the write operation of the data set "01001000" in the first write method, "0" data is written into all the MTJ elements 10 in the first program, as in the example described above.

For the programming of "0" data, the control voltage VCNT having the voltage value Va is applied to the eight MTJ elements 10 in the memory cell string MS. In a state where the control voltage VCNT having the voltage value Va is applied to the eight MTJ elements 10, the write current Iwr2 is supplied to the common electrode 20. The write current Iwr2 flows from the XB side (the first MTJ element 10-1 side) of the common electrode 20 to the XA side (the eighth MTJ element 10-8 side) of the common electrode 20.

In the second program of the write operation of the data set "01001000", an MTJ element into which "1" data is programmed is selected.

Figure 12:
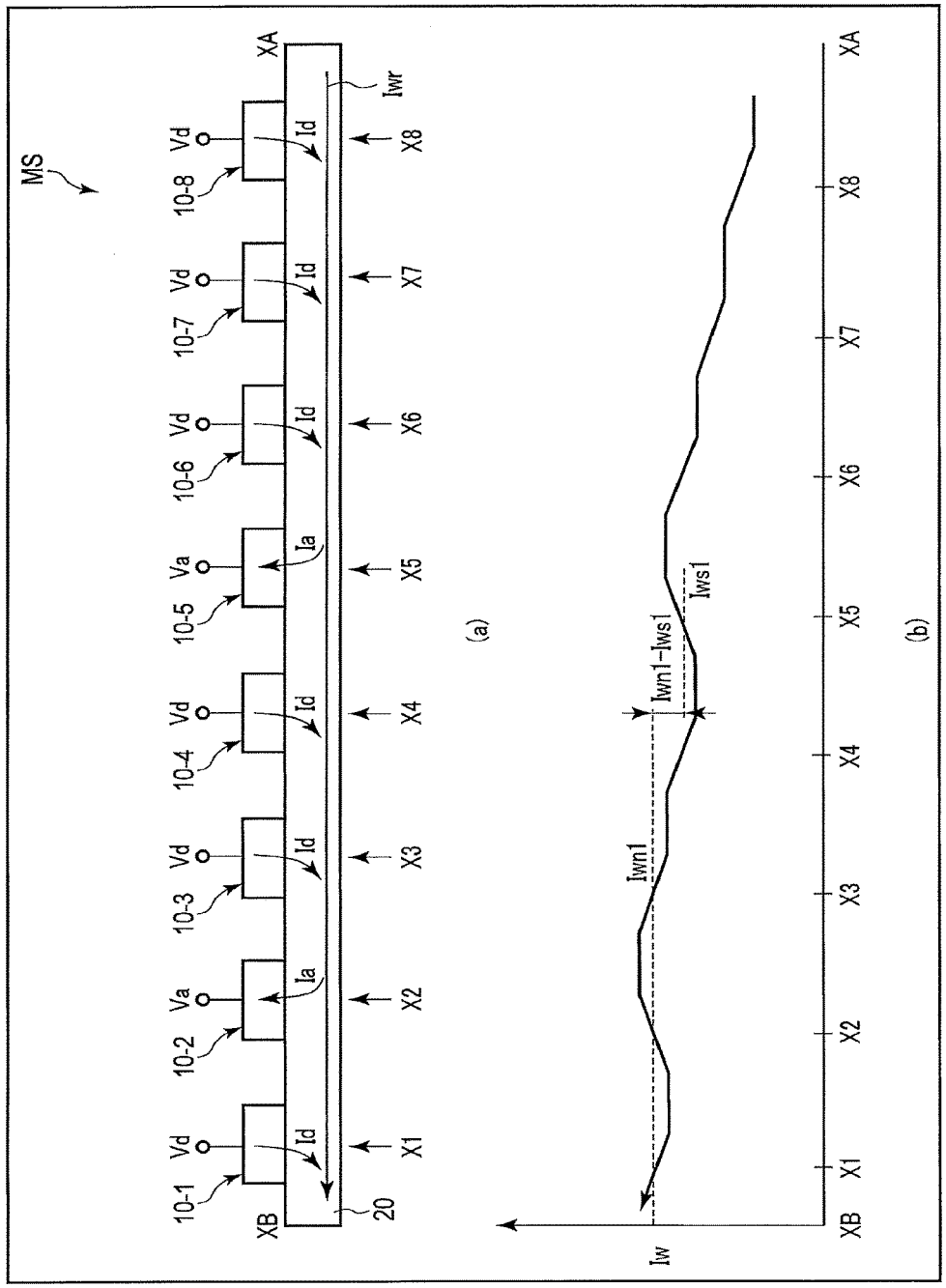
FIG. 12 is a diagram illustrating an operation example of the magnetic memory according to the first embodiment.

FIG. 12 is a schematic diagram illustrating a write operation in the MRAM according to the present embodiment.

(a) of FIG. 12 is a diagram schematically showing the flow of the current in the memory cell string during the second program of the write operation.

(b) of FIG. 12 is a diagram schematically showing the change of the current value of the write current at each position of the common electrode in (a) of FIG. 12.

In (b) of FIG. 12, a horizontal axis of the graph indicates relative positions of the MTJ element on the electrode 20, and a vertical axis of the graph indicates the current value of the effective write current.

As shown in (a) of FIG. 12, the write current Iwr1 flows from the XA side of the common electrode 20 to the XB side. The supply source side of the write current Iwr1 is the eighth MTJ element side (the XA side of the common electrode 20).

In the programming of "1" data, two MTJ elements 10-2 and 10-5 are selected. The other six MTJ elements 10 are set to unselected elements.

As described above, the current value of the write current Iwr1 decreases due to the current Ia resulting from the selected elements 10-2 and 10-5. The current value of the write current Iwr increases due to the current Id resulting from the unselected elements 10-1, 10-3, 10-4, 10-6, 10-7, and 10-8.

As shown in (b) of FIG. 12, the current value of the effective write current Iwr1 is higher at the positions of the first MTJ element 10-1 and the third MTJ element 10-3 of the common electrode 20.

Magnetization switching (unintended magnetization switching) by errors in the unselected MTJ elements tends to occur along with the increase of the current value of the effective write current Iwr.

Thus, the occurrence probability of erroneous writing is higher in the first MTJ element 10-1 or the third MTJ element 10-3 among the six unselected elements than the other unselected elements.

Regarding the selected element, magnetization switching of the storage layer in the selected MTJ element becomes harder to occur along with the decrease of the current value of the write current Iwr1. Therefore, in the selected element, the probability of write errors (probability that magnetization switching of the storage layer does not occur) increases due to the decrease of the current value of the write current.

In the present example, as shown in (b) of FIG. 12, the current value of the write current Iwr1 at the position X5 of the fifth MTJ element 10-5 of the two selected elements 10-2 and 10-5 is lower than the current value of the write current Iwr1 at the position of the second MTJ element 10-2.

Thus, the probability of write errors in the fifth MTJ element 10-5 is higher than the probability of write errors in the second MTJ element 10-2.

Herein, the current value of the effective write current Iwr1 at the position X1 of the MTJ element 10-1 (or the position X3 of the MTJ element 10-3) is represented as "Iwn1". The current value of the effective write current Iwr at the position X5 of the MTJ element 10-5 is represented as "Iws1".

Both the current value Iwn1 and the current value Iws1 at the respective positions of the common electrode 20 are preferably set in the vicinity of the value of the error inhibition condition to inhibit the occurrence of erroneous writing in the unselected element and a write error in the selected element.

For example, an average value of the current value Iwn1 and the current value Iws1 is set as a suitable value (suitable conditions) for the current value of the write current Iwr to inhibit a write error in the selected element and erroneous writing in the unselected element.

For example, in the second program during the write operation, the write circuit 140 sets the current value of the write current on the basis of an average value of a current value Iws2 and a current value Iwn2 (or a current value between the current value Iws2 and the current value Iwn2). The write circuit 140 outputs a write current having the set current value.

Accordingly, both the current value of the effective write current for the selected element and the current value of the effective write current for the unselected element can be set to values proximate to the error inhibition condition.

Regarding the error inhibition condition in the write operation in the selected memory cell string, the current value of the write current Iwr1 is preferably set at least between the maximum current value Iwn1 for the unselected element and the minimum current value Iws1 for the selected element.

As described above, in the MTJ elements 10 arranged on one common electrode 20 in the VoCSM type MRAM according to the present embodiment, the current value (initial value, set value) of the write current Iwr is set between the current value Iws1 of the effective write current for the element having the lowest current value among the selected elements, and the current value Iwn1 of the effective write current Iwr for the element having the highest current value among the unselected elements.

Thus, the VoCSM type MRAM according to the present embodiment can effectively reduce the effect of the fluctuation of the write current resulting from the application of the control voltage VCNT (the voltage value Va or Vd) to the MTJ element 10.

Note that in the example shown herein, the current value of the write current is adjusted to set the error inhibition condition of the selected element and the unselected element. However, the error inhibition condition may be set by the adjustment of the pulse width of the write current and by the adjustments of both the pulse width and the current value.

<Write Operation of Second Write Method>

An example in which "0" data is programmed after programming of "1" data regarding the data set "01001000" is described with reference to FIG. 13.

In the first program of the write operation of the data set "01001000", the control voltage VCNT having the voltage value Va is applied to eight MTJ elements 10 in the memory cell string MS to program the "1" data. In a state where the control voltage VCNT having the voltage value Va is applied to the eight MTJ elements 10, the write current Iwr is supplied to the common electrode 20. The write current Iwr1 flows from the XA side (the eighth MTJ element 10-8 side) of the common electrode 20 to the XB side (the first MTJ element 10-1 side) of the common electrode 20.

In the first program, there are no unselected elements. Therefore, the current value of the write current Iwr1 can be set to a value sufficiently higher than the magnetization switching threshold to the extent that the MTJ elements do not break. This inhibits the occurrence of a write error in the first program.

In the second program of the write operation of the data set "01001000", an MTJ element into which "0" data is programmed is selected. "0" data is written into the selected elements. In this example, the selected elements are six MTJ elements 10-1, 10-3, 10-4, 10-6, 10-7, and 10-8. The unselected elements are two MTJ elements 10-2 and 10-5.

Figure 13:
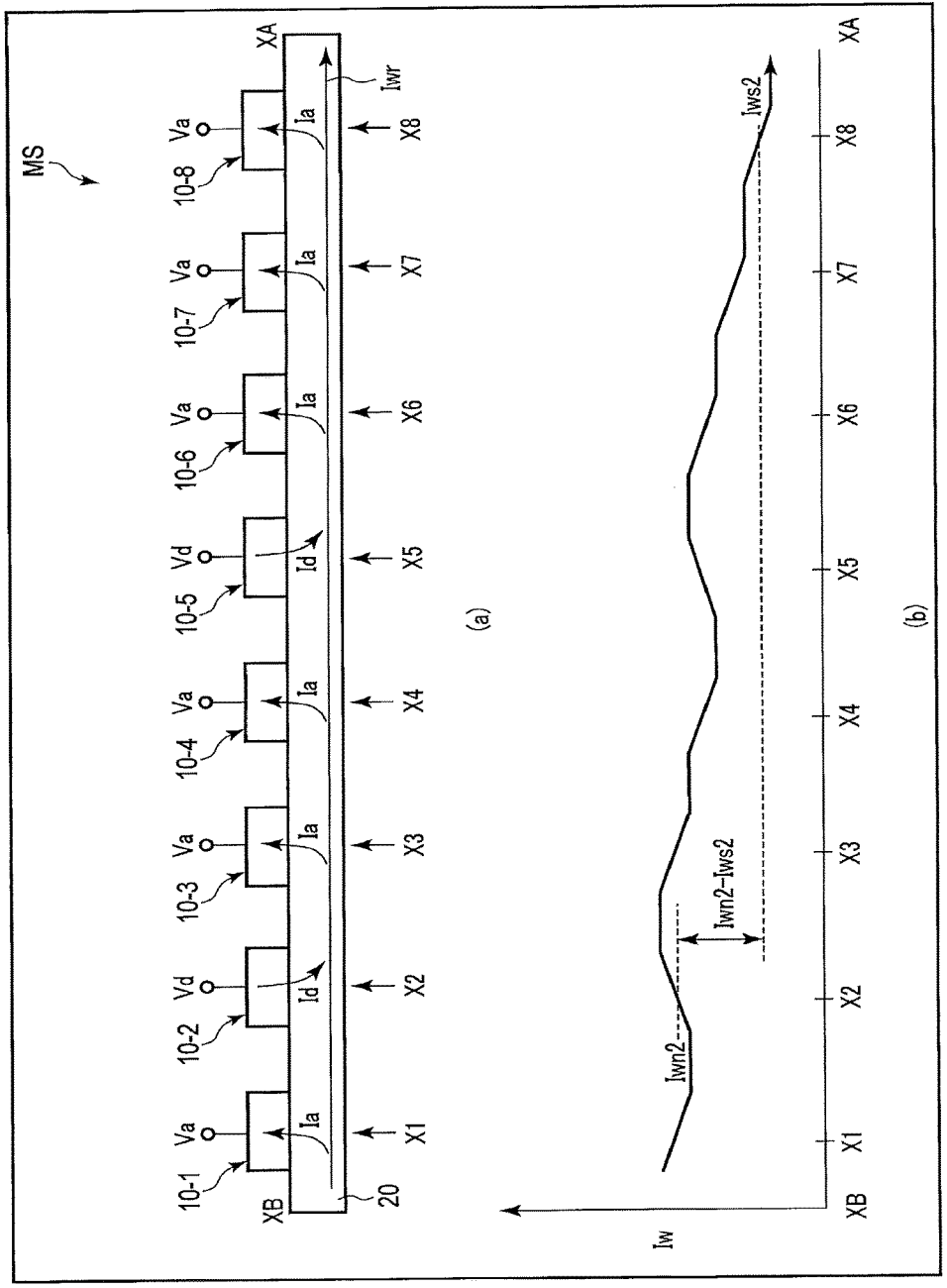
FIG. 13 is a diagram illustrating an operation example of the magnetic memory according to the first embodiment.

FIG. 13 is a schematic diagram illustrating a write operation in the MRAM according to the present embodiment.

(a) of FIG. 13 is a diagram schematically showing the flow of the current in the memory cell string during the second program of the write operation.

(b) of FIG. 13 is a diagram schematically showing the change of the current value of the write current at each position of the common electrode in (a) of FIG. 13.

In (b) of FIG. 13, a horizontal axis of the graph indicates relative positions of the MTJ element on the electrode 20, and a vertical axis of the graph indicates the current value of the effective write current.

As shown in (a) of FIG. 13, the control voltage VCNT having the voltage value Va is applied to six selected elements 10-1, 10-3, 10-4, 10-6, 10-7, and 10-8. The control voltage VCNT having the voltage value Vd is applied to two unselected elements 10-2 and 10-5.

In a state where the control voltage VCNT is applied to each of the MTJ elements 10, the write current Iwr2 is supplied to the common electrode 20. The write current Iwr2 flows from the XB side (the first MTJ element 10-1 side) of the common electrode 20 to the XA side (the eighth MTJ element 10-8 side) of the common electrode 20.

During the application of the control voltage VCNT to the MTJ element 10, the current value of the write current Iwr2 decreases due to the current Ia resulting from the selected elements. During the application of the control voltage VCNT, the current value of the write current Iwr2 increases due to the current Id resulting from the unselected elements.

As shown in (b) of FIG. 13, the current value of the write current Iwr2 at the position X8 of the eighth MTJ element 10-8 among the six selected elements is lower than the current value of the write current Iwr2 at the positions of the other unselected MTJ elements.

The current value of the write current Iwr2 at the position X2 of the second MTJ element 10-2 among the two unselected elements is higher than the current value of the write current Iwr2 at the position X5 of the fifth MTJ element 10-5.

Herein, the current value of the effective write current Iwr2 at the position X8 of the MTJ element 10-8 is represented as "Iws2". The current value of the effective write current Iwr2 at the position X2 of the MTJ element 10-2 is represented as "Iwr2".

In the error inhibition condition regarding the current value of the effective write current Iwr2, the current value of the write current Iwr2 is set to the average value of the current value Iws2 and the current value Iwn2 or at least between the current value Iws2 and the current value Iwn2, as in the example described above.

For example, in the second program during the write operation, the write circuit 140 sets the current value of the write current on the basis of the average value of the current value Iws2 and the current value Iwn2 (or the current value between the current value Iws2 and the current value Iwn2). The write circuit 140 outputs a write current having the set current value.

Thus, even when the write operation of the second pattern is performed as in the present example, the effect of the fluctuation of the current value of the write current Iwr2 on the occurrence of a write error and the erroneous writing can be reduced in the VoCSM type MRAM according to the present embodiment.

As described above, in the examples of FIG. 12 and FIG. 13, "1" and "0" data are written in different program sequences regarding the same data set.

A difference (Iws1−Iwn1) between the current value Iws1 and the current value Iwn1 in the effective write current in FIG. 12 is smaller than a difference (Iws2-Iwr2) between the current value Iws2 and the current value Iwr2 in the effective write current in FIG. 13.

This result shows that regarding the write operation of the data set "01001000", the occurrence probability of error in the writing of data in the write operation of the first pattern in FIG. 12 can be lower than the occurrence probability of error in the writing of data in the write operation of the second pattern in FIG. 13.

This is because when the condition of the current value of the write current is set between the minimum current value Iws for the selected element and the maximum current value Iwn for the unselected element, the pattern of write operation in FIG. 12 is closer to an ideal condition than the pattern of write operation in FIG. 13.

Thus, it is possible to bring the write current in the write operation into a proper state by controlling a write sequence of "1" data and "0" data in accordance with the data set to be written.

In the present embodiment, conditions of the write operation are preferably set on the basis of Items [A] and [B] below to inhibit the occurrence of errors in the MTJ elements in the memory cell string.

The first write method (program pattern) indicates a write operation in which "0" data is programmed in the first program, and "1" data is programmed in the second program. Moreover, the second write method indicates a write operation in which "1" data is programmed in the first program, and "0" data is programmed in the second program.

[A] One of the first write method and the second write method is selected which has a smaller difference between the lowest value Iws of the current values of the write current for one or more selected elements and the highest value Iwn of the current values of the write current for one or more unselected elements in the second program.

[B] In the selected write method, the condition of the current value of the write current is set to the average value of the current value Iws and the current value Iwn or any value between the current value Iws and the current value Iwn.

A write operation for the memory cell string is preferably controlled and executed on the basis of both Items [A] and [B]. However, even when the write operation for the memory cell string is executed only by one of Items [A] and [B], the effect of the fluctuation of the write current on the MTJ elements can be eased.

As described above, in the writing of data in Example 3, the MRAM according to the present embodiment can reduce errors in the writing of data.

(4) Specific Examples

A specific example of the VoCSM type MRAM according to the present embodiment to which the above control of the write operation is applied is described with reference to FIG. 14.

Figure 14:
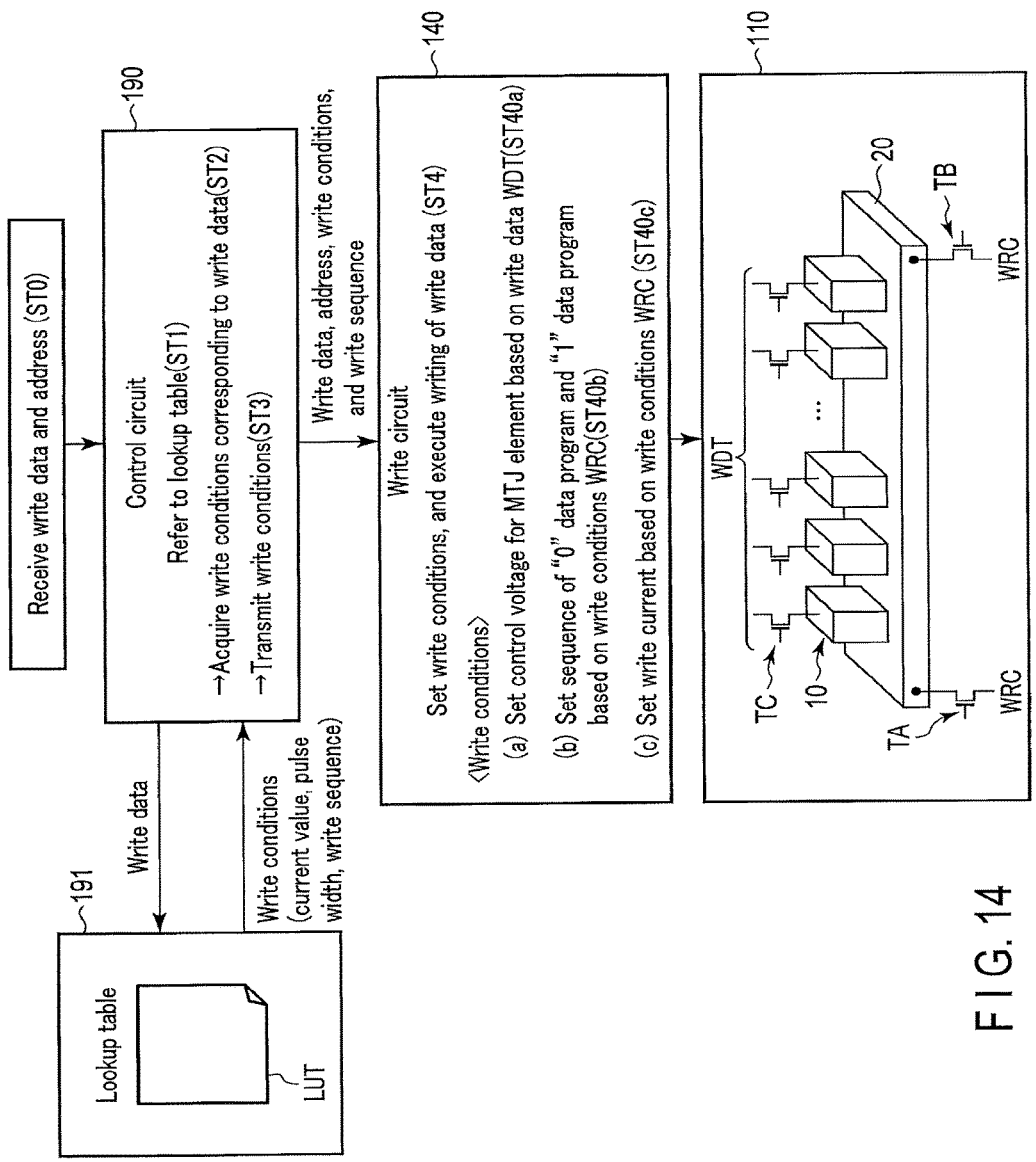
FIG. 14 is a diagram illustrating a specific example of the magnetic memory according to the first embodiment.

FIG. 14 is a schematic diagram showing a specific example of the MRAM according to the present embodiment. FIG. 14 shows the configuration of the MRAM according to the present embodiment, and shows a flow of various kinds of control for the write operation.

As shown in FIG. 14, the lookup table LUT for the control of the write operation is created, and stored in the information holding circuit 191 of the MRAM (or the built-in memory 51 of the memory controller 5).

The lookup table LUT is the control information regarding the write operation showing, for a data set that can be stored in the memory cell string MS, the correspondence between the data set and write conditions. The lookup table LUT includes a predetermined number of bits of data sets and the corresponding write conditions.

As in the example described above, when the memory cell string includes 8 MTJ elements, the data set is 8-bit data. The 8-bit data has 256 combinations of "1" and "0".

FIG. 15 is a diagram showing one example of the lookup table of the data set and the write conditions in the MRAM according to the present embodiment.

As shown in FIG. 15, information such as write sequences of "0" and "1", current values X1, X2, and X3 of write currents, and pulse widths W1, W2, and W3 of the write currents is stored in the lookup table LUT for each of the data sets (8-bit data).

For example, the lookup table LUT is stored in the memory controller 5 or the MRAM 1 before the execution of the write operation. The lookup table LUT is stored in a predetermined storage area at the time of the shipment of the memory system or the MRAM or at the time of power application to the memory system or the MRAM.

The lookup table LUT may be created on the basis of a simulation result of the operation of the MRAM, an experimental result of the operation of the MRAM, and a result of a test process at the time of the shipment of the MRAM. Moreover, the lookup table LUT may be created and updated on the basis of a result of the write operation of the MRAM.

Regarding the operation of the memory system, the host device 900 requests writing of a data set. The host device 900 transmits a write request and a data set (write data) to the memory controller 5.

The memory controller 5 receives the write request and the data set. In response to the write request, the memory controller 5 transmits a write command, the data set, and a selected address to the MRAM 1.

The MRAM 1 receives the write command, the data set, and the selected address (step ST0).

In the MRAM 1, the control circuit 190 refers to the lookup table LUT in the information holding circuit 191 on the basis of a data set (write data) WDT from the memory controller 5 (step ST1).

The control circuit 190 acquires write conditions corresponding to the data set WDT by referring to the lookup table LUT (step ST2).

The control circuit 190 transmits the acquired write conditions to the write circuit 140 together with the data set and the address (step ST3).

Note that when the memory controller 5 is holding the lookup table LUT, the memory controller 5 refers to the lookup table LUT in the built-in memory 51 after receiving the data set from the host device 900.

The memory controller 5 acquires write conditions corresponding to the data set on the basis of the reference result in the lookup table LUT. The memory controller 5 transmits the acquired write conditions to the MRAM 1 together with the command and the write data.

For example, the selected address is supplied to the decode circuit 130. The selected address is decoded by the decode circuit 130. Thus, a memory cell string corresponding to the selected address is selected and activated.

The data set and the write conditions are supplied to the write circuit 140.

The write circuit 140 writes the data set WDT into the selected memory cell string in the memory cell array 100 on the basis of the data set and the write conditions (step ST4).

The write circuit 140 sets the control voltage VCNT for the MTJ element 10 on the basis of the write data WDT (step ST40a).

Accordingly, the voltage VCNT having the voltage value Va or Vd is applied to the reference layer of the MTJ element 10 via the transistor TC depending on whether the MTJ element 10 is selected or unselected.

Sequences of the programming of "0" data and "1" data (the first and second write methods) are set on the basis of write conditions WRC (step ST40b).

At least one of the current value and pulse width of the write current is set on the basis of the write conditions WRC (step ST40c). As has been described with reference to FIG. 11 to FIG. 13, the write circuit 140 sets the current value of the write current on the basis of the value between the current value Iwn and the current value Iws, and controls the increase (or decrease) of the pulse width of the write current.

Thus, the write circuit 140 supplies the write current corresponding to the error inhibition condition via the transistor TA and the transistor TB.

Note that if the current value of the write current output by the write circuit 140 is a current value that satisfies the error inhibition condition in the common electrode 20, the current value of the write current immediately after output from the write circuit 140 may be out of the error inhibition condition.

As above, the write operation is performed in the VoCSM type MRAM according to the present embodiment.

The data set is written into the memory cell string MS by the write operation under the condition in which the occurrence of errors is inhibited.

As a result, the number of errors in the memory cell string is reduced in the VoCSM type MRAM according to the present embodiment.

As above, the write operation is completed in the VoCSM type MRAM according to the present embodiment.

<Verification>

Figure 16:
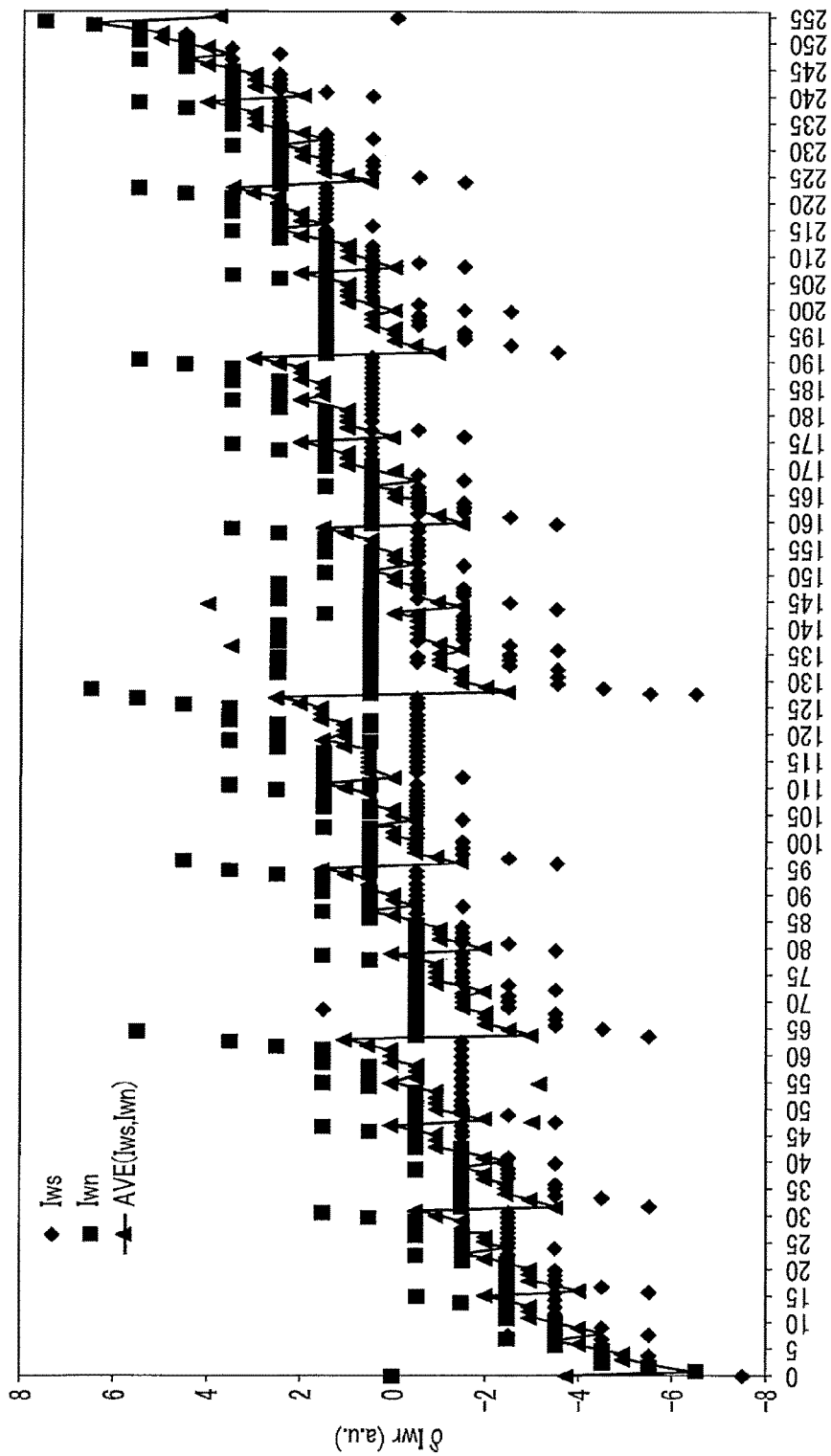
FIG. 16 is a graph illustrating a specific example of the magnetic memory according to the first embodiment.
Figure 17:
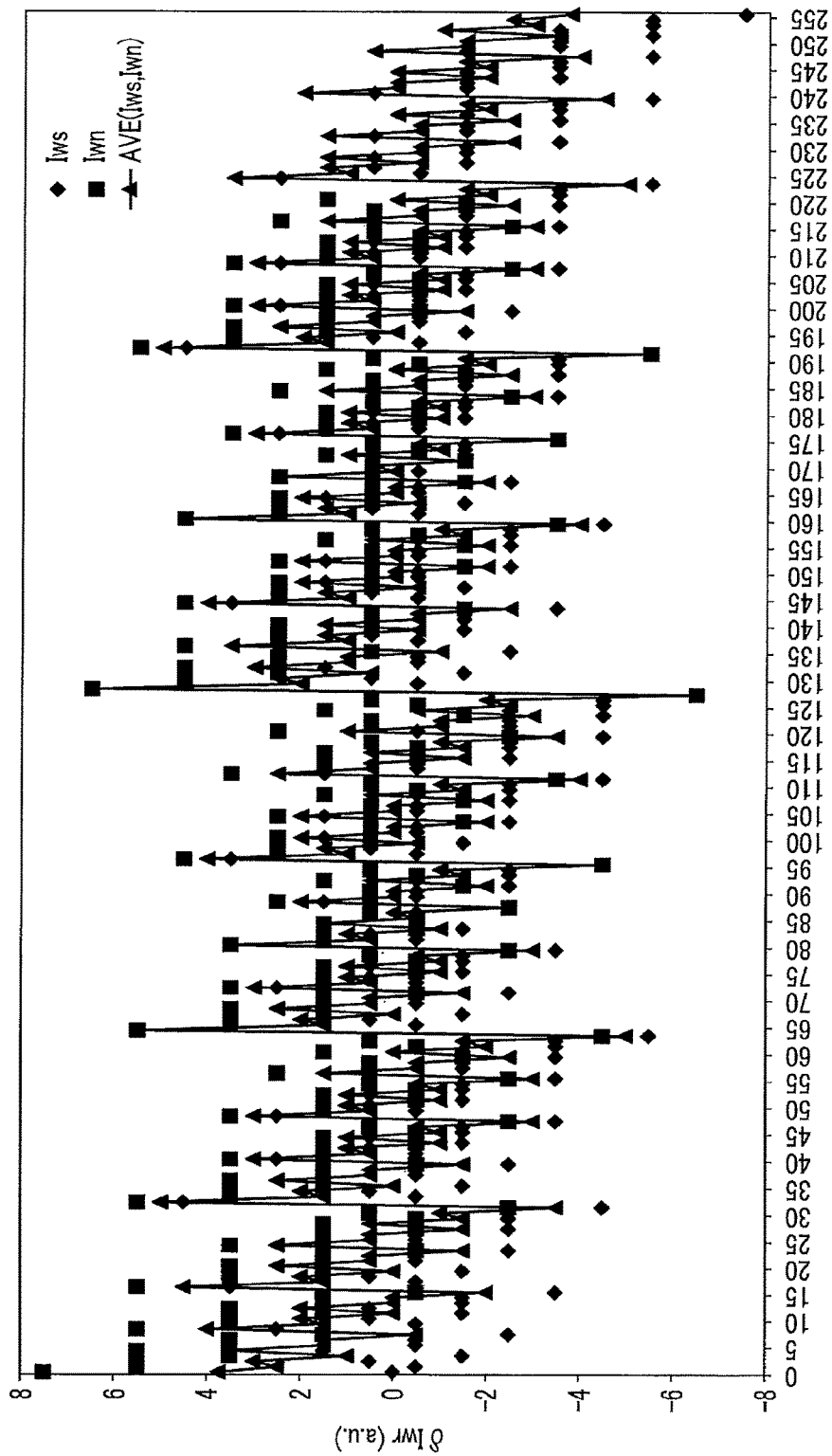
FIG. 17 is a graph illustrating a specific example of the magnetic memory according to the first embodiment.

FIG. 16 and FIG. 17 are graphs used to verify the current value of the write current in the MRAM according to the present embodiment.

FIG. 16 and FIG. 17 show one example of calculation results of the current value Iws and the current value Iwn of the write current for data sets (8-bit data) having 256 patterns.

In the example shown in FIG. 16, "0" data is programmed into a selected element in the second program. In this case, "1" data is programmed in the first program.

In the example shown in FIG. 17, "1" data is programmed in the selected element in the second program. In this case, "0" data is programmed in the first program.

In FIG. 16 and FIG. 17, a horizontal axis of the graph corresponds to the value of the data set. On the horizontal axis of the graph, the value of the data set is decimally indicated. For example, when the above-mentioned data set "01001000" is decimally indicated, its value is 72. Therefore, in FIG. 16 and FIG. 17, the data set "01001000" is indicated by the value 72.

In FIG. 16 and FIG. 17, a vertical axis of the graph corresponds to "δIwr". "δIwr" indicates a fluctuation amount of the current value of the write current Iwr resulting from the control voltage applied to the MTJ element.

In FIG. 16 and FIG. 17, an origin of the vertical axis of the graph indicates the current value (initial value, set value) of the write current when the current value resulting from the control voltage does not fluctuate. The graphs in FIG. 16 and FIG. 17 show the amount of deviation of each data set from a current value having no fluctuation.

Herein, as an assumption of the calculation, an absolute value of the voltage value Va is set to the same magnitude as an absolute value of the voltage value Vd in the control voltages applied to the selected element and the unselected element in the memory cell string. The polarity of the voltage value Va is opposite to the polarity of the voltage value Vd. Therefore, the voltage value Va and the voltage value Vd have a relation Va=−Vd.

The vertical axis of the graph indicates a value on a scale of |Va|/R. "R" indicates a resistance value of the MTJ element. As described above, the resistance value of the MTJ element includes a resistance value Rmin of a low-resistance state and a resistance value Rmax of a high-resistance state. Herein, a resistance value R of the MTJ element is set to a fixed value. For example, an average value of the resistance value Rmin and the resistance value Rmax is used for the resistance value R as an approximate value.

The current value Iws indicates a minimum value of the current value of the effective write current in one or more selected elements in the memory cell string MS.

The current value Iwn indicates a maximum value of the current value of the effective write current in one or more unselected elements in the memory cell string MS.

Furthermore, a value AVE is the average value of the current value Iws and the current value Iwn. The current value of the write current output by the write circuit 140 is adjusted so that the average value AVE fulfils the error inhibition condition (e.g. the optimum condition) of the write current as the current value of the write current Iwr.

As described above, δIwr indicates the fluctuation amount of the write current Iwr. Therefore, when δIwr in a certain data set is a positive value, conditions of the write current are set so that the current value decreases. When δIwr in a certain data set is a negative value, conditions of the write current are set so that the current value increases.

It is possible to hold down the number of conditions of the write current stored in the lookup table LUT by grouping the value of δIwr (the average value of the current value Iws and the current value Iwn).

For example, when δIwr has a relation "−2|Va|/R<δIwr≤2|Va|/R", δIwr=0 is set (group 1). When the value δIwr has a relation "δIwr≤−2|Va|/R", δIwr=−4|Va|/R is set (group 2). When the value δIwr has a relation "δIwr>2|Va|/R", δIwr=4|Va|/R is set (group 3).

On the basis of δIwr of each of the three groups, the current value of the write current (e.g. the write current output by the write circuit) is set.

Thus, the write conditions of the three groups are set for 256 data sets.

Note that δIwr may be grouped into five patterns: −4|Va|/R, −2|Va|/R, |Va|/R, +2|Va|/R, and +4|Va|/R. In this case, five write conditions are set. Thus, it is possible to correct the effective write current with a relatively high degree of precision by the segmentation of the groups.

As described above, regarding an execution sequence of "0" programming and "1" programming in a write operation of a certain data set, an execution sequence in which the value of "Iwn−Iws" is lower is preferably selected. This inhibits the effect of the fluctuation of the write current Iwr.

Figure 18:
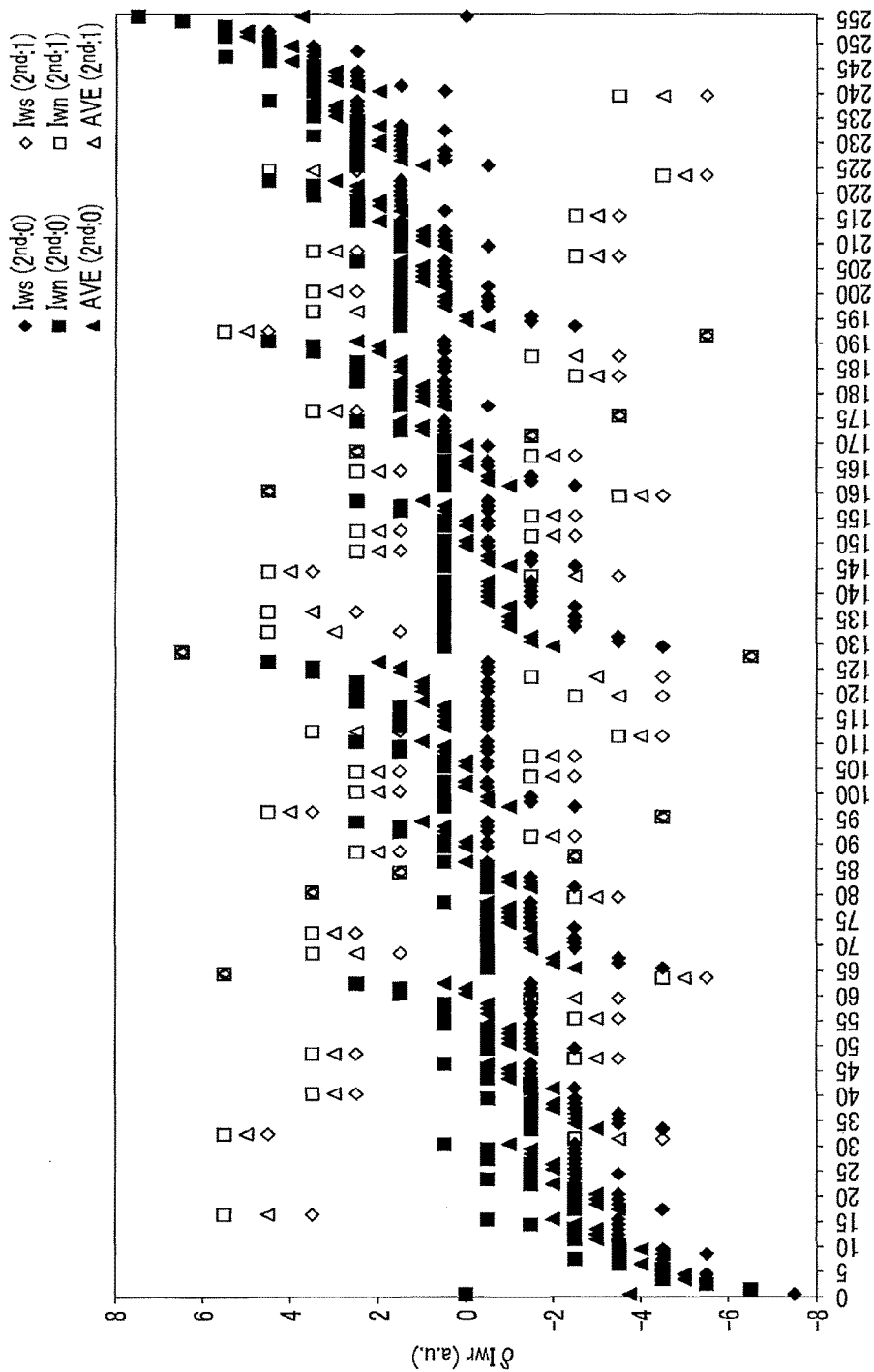
FIG. 18 is a graph illustrating a specific example of the magnetic memory according to the first embodiment.

FIG. 18 is a graph in which smaller values are picked up from "Iwn−Iws" obtained from the two write methods in the write operations of the data set in FIG. 16 and FIG. 17.

In FIG. 18, "Iwn($2^{nd}$: 0)" indicates the value of the current value Iwn in the second program (programming of "0") when the value of Iwn−Iws of the operation (the second write method) in which "1" data is programmed in the first program and "0" data is programmed in the second program can be lower than the value of Iwn−Iws of the operation (the first write method) in which "0" data is programmed in the first program and "1" data is programmed in the second program.

"Iws($2^{nd}$: 0)" indicates the value of the current value Iws in the second program (programming of "0") when the value of Iwn−Iws in the operation of the second write method can be lower than the value of Iwn−Iws in the operation of the first write method.

"Iwn($2^{nd}$: 1)" indicates the value of the current value Iwn in the second program (programming of "1") when the value of Iwn−Iws in the operation of the first write method can be lower than the value of Iwn−Iws in the operation of the second write method.

"Iws($2^{nd}$: 1)" indicates the value of the current value Iws in the second program (programming of "1") when the value of Iwn−Iws in the operation of the first write method can be lower than the value of Iwn−Iws in the operation of the second write method.

"AVE($2^{nd}$: 0)" indicates an average value of Iwn($2^{nd}$: 0) and Iws($2^{nd}$: 0) in each data set. "AVE($2^{nd}$: 1)" indicates an average value of Iwn($2^{nd}$: 1) and Iws($2^{nd}$: 1) in each data set.

Note that when the value of "Iwn−Iws" does not change in the program sequence, any of the two write methods may be selected. Herein, the value in the case where the value of "Iwn−Iws" does not change is allocated to the case where the second program is programming of "0".

As shown in FIG. 18, the value of δIwr corresponding to the data set changes depending on whether the second program is programming of "0" or programming of "1".

Therefore, a program sequence of "0" and "1" is selected in accordance with the data set, whereby the effect of the fluctuation of the current value of the write current on the selected element and the unselected element can be further inhibited than in FIG. 16 and FIG. 17.

Note that in FIG. 16 and FIG. 17, values regarding data sets 0 ("00000000") and 255 ("11111111") are formally plotted. However, there are no unselected elements in the writing of these data sets, so that it is possible to inhibit write errors by performing writing with an effectively sufficiently increased write current of the selected elements. Therefore, additional write conditions may be set for the data sets ("00000000") and 255 ("11111111").

(5) Summary

As described above, the magnetic memory according to the present embodiment can inhibit errors during the write operation by controlling the sequence of programs during the write operation, and the current value and pulse width of the write current.

Therefore, the magnetic memory according to the first embodiment can improve reliability of operation.

(II) Second Embodiment

A magnetic memory according to a second embodiment will be described with reference to FIG. 19 to FIG. 21.

In this embodiment, how a variation σIc of magnetization switching thresholds (values of magnetization switching current) Ic in a plurality of MTJ elements changes is considered, depending on the condition in which an average value of magnetization switching thresholds Ic increases and the condition in which an average value of magnetization switching thresholds decreases.

If the change rate of the magnetization switching threshold due to application of a voltage to an MTJ element is regarded as constant, when the average value of the magnetization switching thresholds Ic becomes k times due to the application of the voltage, the variation σIc also becomes k times.

A variation σIj of a magnetization switching threshold Ij in a plurality of MTJ elements (unselected element) having a large magnetization switching threshold may be larger than a variation σIa of magnetization switching threshold Ik in a plurality of MTJ elements (selected element) having a small magnetization switching threshold.

Herein, a magnetization switching threshold Ij corresponds to an average value (or most frequent value) of magnetization switching thresholds in a distribution of magnetization switching thresholds of unselected elements. A magnetization switching threshold Ik corresponds to an average value (or most frequent value) of magnetization switching thresholds in a distribution of magnetization switching thresholds of selected elements.

In the following, for simplicity of explanations, the current value of the write current Iwr may be represented as "Iwr".

Figure 19:
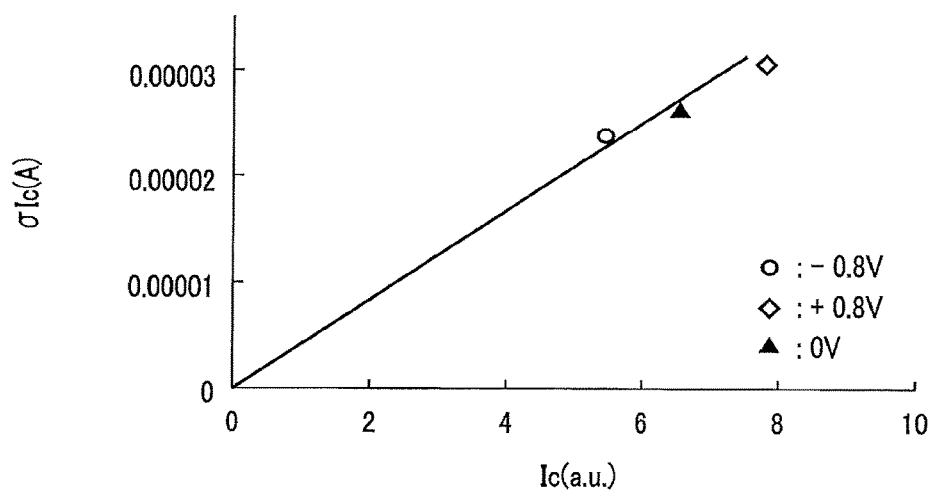
FIG. 19 is a diagram illustrating a magnetic memory according to a second embodiment.

FIG. 19 is a diagram for explaining a tendency of a variation of a magnetization switching threshold in an MRAM of this embodiment.

In FIG. 19, a horizontal axis of the graph corresponds to a magnetization switching threshold (unit: a.u.), and a vertical axis of the graph corresponds to a variation σIc of a magnetization switching threshold Ic (unit: A).

FIG. 19 shows results of measurements of magnetization switching thresholds and variations of the magnetization switching thresholds in an MTJ element to which a negative voltage is applied, an MTJ element to which a positive voltage is applied, and an MTJ element to which a voltage of 0V is applied. The magnetization switching thresholds are measured under condition in which levels of the magnetization switching thresholds are changed by applying voltages to a plurality of MTJ elements. Based on the results of measurements, a variation of the magnetization switching threshold is estimated.

As shown in the example of FIG. 19, regarding magnetization switching thresholds of MTJ elements in a state where a voltage is applied, a variation of magnetization switching thresholds of MTJ elements (unselected MTJ elements) under a condition in which the magnetization switching threshold is increased by applying a positive voltage Vd (for example, +0.8 v) to the MTJ element is larger than a variation of magnetization switching thresholds of MTJ elements (selected MTJ elements) under a condition in which the magnetization switching threshold is decreased by applying a negative voltage Va (for example, −0.8 V) to the MTJ element.

Therefore, in VoCSM type MRAM, the variation of the magnetization switching thresholds of the MTJ elements in an unselected state may be larger than the variation of the magnetization switching thresholds of the MTJ elements in a selected state.

As a result, a set value of a write current for a preferable condition (for example, an optimum condition) can be a value (for example, a value between the line Z3 and the curve Z1), which is smaller than a value based on the line (the center line) Z3 between the error curve Z1 relating to the selected element and the error curve Z2 relating to the unselected element in FIG. 10.

Herein, a write window Wk of a selected element in consideration of the variation σIk of the magnetization switching thresholds of the selected elements is represented as follows:

$$Wk=(Iwr-Ik)/\sigma Ik$$

where a variation σIwk of the write current Iwr is sufficiently small.

A write window Wj of an unselected element in consideration of the variation σIj of the magnetization switching thresholds of the unselected currents is represented as follows:

$$Wj=(Ij-Iwr)/\sigma Ij.$$

In the case where an average value of the magnetization switching threshold Ik of the selected element and the magnetization switching threshold Ij of the unselected element is set as a value of the write current Iwr, if the variation σIj of the magnetization switching threshold Ij is larger than the variation σIk of the magnetization switching threshold Ik, a large width (write window Wk) can be secured between the magnetization switching threshold Ik (the curve Z1 in FIG. 10) and the write current Iwr (the line Z3 in FIG. 10).

On the other hand, the width between the write current Iwr (the line Z3) and the magnetization switching threshold Ij (the line Z2 in FIG. 10) is narrowed, and the width of the write window Wj between the write current Iwr and the magnetization switching threshold Ij is restricted.

In the case where a ratio between a magnetization switching threshold and a variation of magnetization switching thresholds of selected MTJ elements is the same as a ratio between a magnetization switching threshold and a variation of magnetization switching thresholds of unselected MTJ elements (σIk/Ik=σIj/Ij), if the current value of the write current Iwr is set to a value based on Iwr=(Ik+Ij)/2, the width of the write window Wj is narrowed.

Figure 20:
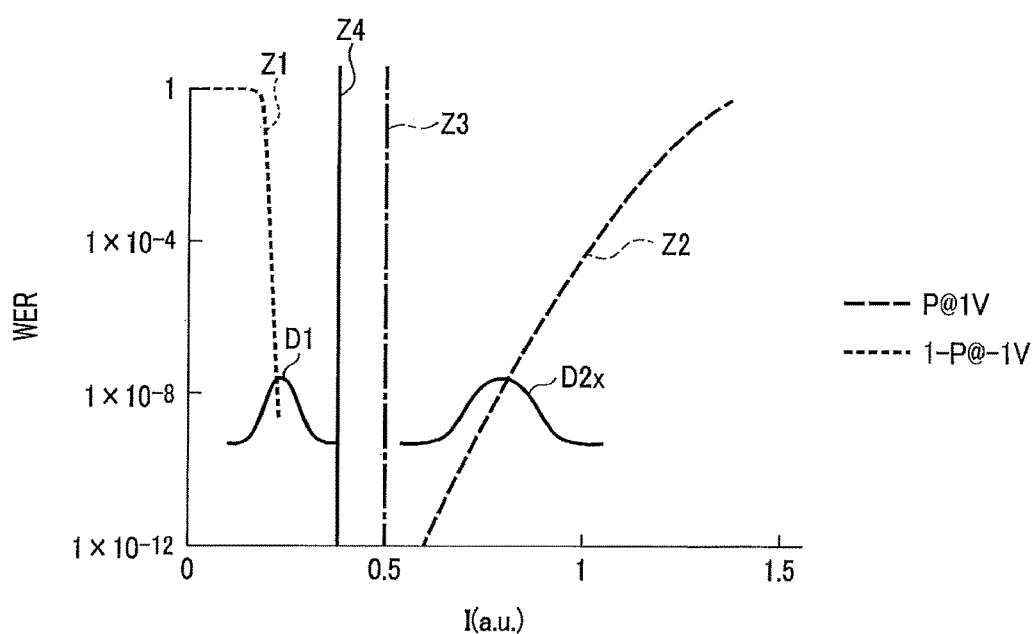
FIG. 20 is a diagram illustrating the magnetic memory according to the second embodiment.

FIG. 20 is a schematic diagram for explaining setting of a write current in a magnetic memory (for example, a VoCSM type MRAM) of the embodiment.

In FIG. 20, a horizontal axis of the graph corresponds to a current I (unit: a.u.), and a vertical axis of the graph corresponds to a write error rate (WER).

In FIG. 20, the variation of the magnetization switching thresholds of the selected MTJ elements corresponds to a distribution D1, and the variation of the magnetization switching thresholds of the unselected MTJ elements corresponds to a distribution D2x. The average value Ij of magnetization switching thresholds relating to the unselected MTJ elements corresponds to a most frequent value of the distribution D2x, and the average value Ik of magnetization switching thresholds relating to the selected MTJ elements corresponds to a most frequent value of the distribution D1.

As shown in FIG. 20, if the variation of a magnetization switching threshold of an unselected element (distribution D2x) is larger than the variation of a magnetization switching threshold of a selected element (distribution D1), a more suitable current value Z4 of a write current is smaller than a value based on (Ij+Ik)/2 represented by the line Z3.

Herein, if the current value Iwr of the write current has the relationship Iwr=(2×Ij×Ik)/(Ij+Ik), the width of the write window Wj is substantially the same as the width of the write window Wk.

In the case where the memory performance is restricted by a smaller one of the write window Wk and the write window Wj, the write windows Wj and Wk are set to more suitable values (for example, optimum values) by satisfying conditions of the write current based on Iwr=(2×Ij×Ik)/(Ij+Ik).

Figure 21:
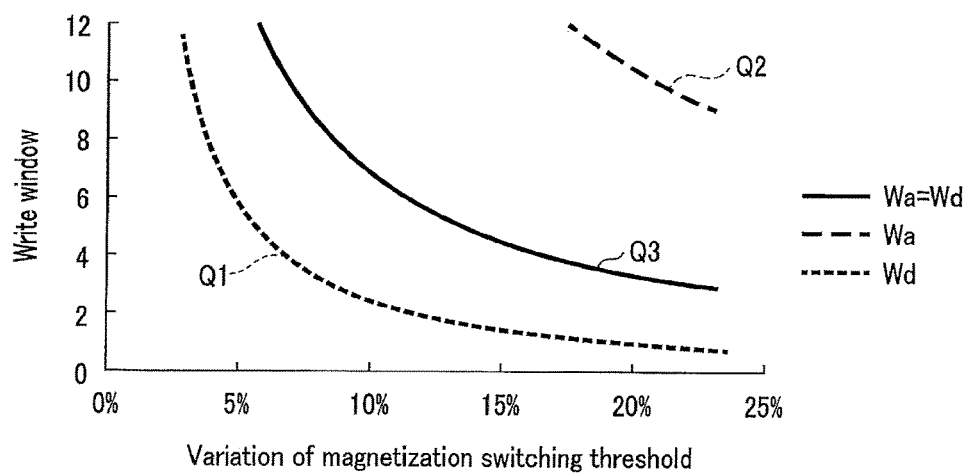
FIG. 21 is a diagram illustrating an operation example of the magnetic memory according to the second embodiment.

FIG. 21 is a diagram for explaining setting of a write current in the MRAM of the embodiment.

FIG. 21 shows a tendency of the values of the write windows Wj and Wk relative to variations of the magnetization switching thresholds in the MTJ elements.

In FIG. 21, a horizontal axis of the graph corresponds to a variation of a magnetization switching threshold (σIj/Ij or σIk/Ik, unit: %), and a vertical axis of the graph corresponds to a value (unit: a.u.) of the write window.

FIG. 21 shows a value of each of the write windows Wj and Wk in the case where the current value of the write current Iwr is set to an average value ((Ij+Ik)/2) of the magnetization switching threshold Ij and the magnetization switching threshold Ik (lines Q1 and Q2) and the case where the write current Iwr is set to (2×Ij×Ik)/(Ij+Ik) (a line Q3).

In the case where the current value of the write current Iwr is set to an average value of the magnetization switching threshold Ik of the selected element and the magnetization switching threshold Ij of the unselected element, the write window Wk for a selected element can be secured to be sufficiently wide as indicated by the line Q1. However, as indicated by the line Q2, the write window Wj for an unselected element is narrow.

In contrast, in the case where the current value of the write current Iwr is set to a value corresponding to (2×Ij×Ik)/(Ij+Ik), the width of the write window Wj is substantially the same as the width of the write window Wk. Therefore, the write windows Wj and Wk change as indicated by the line Q3 in accordance with the variation of the magnetization switching threshold.

As a result, in the VoCSM type MRAM of this embodiment, one of the two windows Wj and Wk can be prevented from being narrowed.

For example, if the write window Wj is set larger than the write window Wk (if it is preferable that the disturb probability of an unselected element be smaller than the write error probability of a selected element), the current value of the write current Iwr is set smaller than the value obtained by (2×Ij×Ik)/(Ij+Ik).

As described above, in the MRAM of this embodiment, the set value of the write current can be set to a value that enables further reduction of the occurrence probability of an error during the write operation.

Therefore, the magnetic memory according to the second embodiment can improve reliability of operation.

(III) Others

In the present embodiment, the in-plane magnetization type MTJ element is used for the magnetoresistive effect element as the memory element. However, a perpendicular magnetization type MTJ element may be used for the memory element in the magnetic memory according to the present embodiment.

In the magnetic memory of this embodiment, the magnetoresistive effect element may have a square or circular planar shape.

In the magnetic memory of this embodiment, an electrode (a conductive layer, an interconnect, or a spin orbit interaction layer) on which magnetoresistive effect elements are disposed in common may be a layer formed of at least one material selected from a metal, such as copper (Cu), rhodium (Rh), palladium (Pd), silver (Ag), hafnium (Hf), osmium (Os), iridium (Ir), platinum (Pt), gold (Au), or bismuth (Bi), an oxide containing one or more of these metals, and a nitride containing one or more of these metals. However, the electrode is not limited to the above materials, as long as it has great spin interaction.

In the present embodiment, the MRAM is shown as an example of the magnetic memory. However, the magnetic memory may be a magnetic memory other than the MRAM as long as such a magnetic memory is a VoCSM using the magnetoresistive effect element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
magnetoresistive effect elements arranged on an conductive layer; and
a first circuit which passes a write current through the conductive layer and applies a control voltage to the magnetoresistive effect elements, to write data including a first value and a second value into the magnetoresistive effect elements,
wherein the first circuit adjusts at least one of a write sequence of the first value and the second value, a current value of the write current, and a pulse width of the write current, on the basis of an arrangement of the first value and the second value in the data.

2. The memory of claim 1, wherein
the first circuit sets the current value of the write current on the basis of first information regarding a distribution of the current value of the write current in the conductive layer dependent on the arrangement of the first value and the second value in the data.

3. The memory of claim 1, wherein
during writing of the data, the magnetoresistive effect elements include at least one selected element and at least one unselected element, and
the current value of the write current is set on the basis of a current value of a first current in the conductive layer for the selected element and a current value of the first current in the conductive layer for the unselected element when the first current is supplied to the conductive layer.

4. The memory of claim 3, wherein
the current value of the write current is set to a value between a minimum value of the current value of the first current in the conductive layer for the selected elements and a maximum value of the current value of the first current in the conductive layer for the unselected elements.

5. The memory of claim 3, wherein
the first current is a current supplied to the conductive layer to write data into the selected element in at least one of an experimental process, a test process, and a simulation process.

6. The memory of claim 1, wherein
during writing of the data, the magnetoresistive effect elements include at least one selected element and at least one unselected element, and
the current value of the write current is set an average value of the magnetization switching threshold of the selected element and the magnetization switching threshold of the unselected element.

7. The memory of claim 6, wherein
when the magnetoresistive effect elements include a plurality of selected elements, the magnetization switching threshold of the selected element is based on an average value of the magnetization switching thresholds of the plurality of selected elements, and
when the magnetoresistive effect elements include a plurality of unselected elements, the magnetization switching threshold of the unselected element is based on an average value of the magnetization switching thresholds of the plurality of unselected elements.

8. The memory of claim 1, wherein
during writing of the data, the magnetoresistive effect elements include at least one selected element and at least one unselected element, and
the current value of the write current is set a value smaller than an average value of the magnetization switching threshold of the selected element and the magnetization switching threshold of the unselected element.

9. The memory of claim 8, wherein
the current value of the write current has a following relationship:

$$Iw \leq (2 \times Ij \times Ik)/(Ij+Ik)$$

where Iw is the current value of the write current, Ij is the magnetization switching threshold of the unselected element, and Ik is the magnetization switching threshold of the selected element.

10. The memory of claim 8, wherein
when the magnetoresistive effect elements include a plurality of selected elements, the magnetization switching threshold of the selected element is based on an average value of the magnetization switching thresholds of the plurality of selected elements, and
when the magnetoresistive effect elements include a plurality of unselected elements, the magnetization switching threshold of the unselected element is based on an average value of the magnetization switching thresholds of the plurality of unselected elements.

11. The memory of claim 1, wherein
the first circuit determines the write sequence in accordance with the arrangement of the first value and the second value in the data.

12. The memory of claim 1, wherein
the write sequence includes
a first sequence in which the second value is written into one or more selected elements among the magnetoresistive effect elements after the first value is written into the magnetoresistive effect elements, and a second sequence in which the first value is written into one or more selected elements among the magnetoresistive effect elements after the second value is written into the magnetoresistive effect elements, and the first circuit selects one of the first sequence and the second sequence in accordance with the arrangement of the first value and the second value in the data.

13. The memory of claim 1, further comprising:

a second circuit which holds second information indicating a relation between the arrangement of the first value and the second value in the data, and at least one of the write sequence, the current value of the write current, and the pulse width of the write current.

14. The memory of claim 13, wherein the first circuit sets a condition to write the data with reference to the second information on the basis of the data during a write operation.

15. The memory of claim 1, wherein the first circuit receives the data, and third information regarding a condition to write the data, and the third information includes at least one of the write sequence, the current value of the write current, and the pulse width of the write current.

16. The memory of claim 1, wherein during writing of the data, the magnetoresistive effect elements include at least one selected element and at least one unselected element, and the first circuit applies the control voltage having a first polarity to the selected element, and applies the control voltage having a second polarity to the unselected element.

17. The memory of claim 1, wherein each of the magnetoresistive effect elements includes a first magnetic layer, a second magnetic layer between the first magnetic layer and the conductive layer, and a nonmagnetic layer between the first magnetic layer and the second magnetic layer.

18. The memory of claim 17, wherein the first magnetic layer has a magnetization in a fixed state, and the second magnetic layer has a variable magnetization.

19. The memory of claim 17, wherein a direction of magnetization of the second magnetic layer is switched by a spin Hall effect.

* * * * *